United States Patent
Judge et al.

(10) Patent No.: US 9,313,914 B2
(45) Date of Patent: Apr. 12, 2016

(54) SLIDE ASSEMBLY

(71) Applicant: Jonathan Manufacturing Corporation, Irvine, CA (US)

(72) Inventors: Ronald J. Judge, Corona, CA (US); Ramiro A. Perez, Santa Ana, CA (US)

(73) Assignee: Jonathan Manufacturing Corporation, Irvine, CA (US)

(*) Notice: Subject to any disclaimer, the term of this patent is extended or adjusted under 35 U.S.C. 154(b) by 0 days.

(21) Appl. No.: 14/197,641

(22) Filed: Mar. 5, 2014

(65) Prior Publication Data

US 2014/0265788 A1 Sep. 18, 2014

Related U.S. Application Data

(60) Provisional application No. 61/780,677, filed on Mar. 13, 2013.

(51) Int. Cl.
*A47B 88/00* (2006.01)
*H05K 7/14* (2006.01)
*A47B 88/04* (2006.01)

(52) U.S. Cl.
CPC .............. *H05K 7/1489* (2013.01); *A47B 88/00* (2013.01); *A47B 88/04* (2013.01)

(58) Field of Classification Search
CPC .... A47B 88/04; A47B 88/0466; A47B 88/08; A47B 88/10; A47B 88/14; A47B 2088/0403; A47B 2210/0016; A47B 2210/0018; A47B 2210/0037; A47B 2210/0043; A47B 2210/0059; A47B 2210/007; A47B 2210/0027
USPC ............... 312/333, 334.44, 334.47, 223.1, 312/265.1–265.4, 334.4, 334.5, 334.12, 312/334.18
See application file for complete search history.

(56) References Cited

U.S. PATENT DOCUMENTS

| | | | |
|---|---|---|---|
| 1,736,108 A | 11/1929 | Anderson | |
| 3,141,714 A | 7/1964 | Valitus | |
| 3,142,517 A | 7/1964 | Ward | |
| 3,177,047 A | 4/1965 | Mutchnik et al. | |
| 3,292,985 A | 12/1966 | Buhrmaster | |

(Continued)

FOREIGN PATENT DOCUMENTS

GB   1 517 259   7/1978

OTHER PUBLICATIONS

Jonathan Engineering, Medium Duty Steel Slides, Series 340; archived Nov. 12, 2012; 2 pages; printed from website on Jul. 15, 2015; http://web.archive.org/web/20121112080301/http://www.jonathanengr.com/series-340-c-103.html.

*Primary Examiner* — Janet M Wilkens
(74) *Attorney, Agent, or Firm* — Knobbe, Martens, Olson & Bear LLP

(57) ABSTRACT

Slide assemblies that include at least an inner slide segment and an outer slide segment. Many of the slide assemblies also include an intermediate slide segment interposed between the inner slide segment and the outer slide segment. The inner and outer slide segments include a plurality of rollers separated into upper rows and lower rows. The slide assembly can also include lock arrangements to secure individual slide segments in desired positions relative to one another. The slide assemblies preferably include mounting brackets, which, in some arrangements, include mounting pin assemblies capable of use with at least three mounting hole sizes or shapes.

16 Claims, 18 Drawing Sheets

(56) References Cited

U.S. PATENT DOCUMENTS

| | | | |
|---|---|---|---|
| 3,371,968 A | 3/1968 | George | |
| 3,650,578 A * | 3/1972 | Del Vecchio et al. | 384/18 |
| 3,975,063 A | 8/1976 | Mahotka et al. | |
| 4,080,686 A | 3/1978 | Hagen | |
| 4,112,539 A | 9/1978 | Hagen | |
| 4,549,773 A | 10/1985 | Papp et al. | |
| 4,560,212 A | 12/1985 | Papp et al. | |
| 4,749,242 A | 6/1988 | Rechberg | |
| 4,961,648 A | 10/1990 | Rock | |
| 5,033,805 A | 7/1991 | Hobbs | |
| 5,262,923 A | 11/1993 | Batta et al. | |
| 5,314,253 A * | 5/1994 | Grass, Jr. | 384/19 |
| 5,344,228 A | 9/1994 | Kovarik et al. | |
| 5,484,197 A | 1/1996 | Hansen et al. | |
| 5,571,256 A | 11/1996 | Good et al. | |
| 6,209,979 B1 | 4/2001 | Fall et al. | |
| 6,269,959 B1 | 8/2001 | Haworth | |
| 6,422,399 B1 | 7/2002 | Castillo et al. | |
| 6,609,619 B2 | 8/2003 | Abbott | |
| 6,702,412 B2 | 3/2004 | Dobler et al. | |
| 6,749,275 B2 | 6/2004 | Cutler et al. | |
| 6,749,276 B2 * | 6/2004 | Judge et al. | 312/334.47 |
| 6,773,080 B2 | 8/2004 | Chen et al. | |
| 6,830,300 B2 | 12/2004 | Lauchner | |
| 6,851,773 B2 | 2/2005 | Chen et al. | |
| 6,860,575 B2 | 3/2005 | Chen et al. | |
| 6,883,884 B2 | 4/2005 | Chen et al. | |
| 6,929,336 B2 | 8/2005 | Liu et al. | |
| 6,935,710 B2 | 8/2005 | Chen et al. | |
| 6,942,307 B1 * | 9/2005 | Lammens | 312/334.46 |
| 6,962,397 B2 | 11/2005 | Dobler et al. | |
| 6,976,745 B2 | 12/2005 | Dobler et al. | |
| 7,134,802 B2 | 11/2006 | Doerr et al. | |
| 7,144,184 B1 | 12/2006 | Tsai | |
| 7,281,633 B2 | 10/2007 | Hartman et al. | |
| 7,281,694 B2 | 10/2007 | Allen et al. | |
| 7,303,361 B1 | 12/2007 | Lane | |
| 7,318,532 B1 | 1/2008 | Lee et al. | |
| 7,357,362 B2 | 4/2008 | Yang et al. | |
| 7,364,244 B2 | 4/2008 | Sandoval | |
| 7,520,577 B2 * | 4/2009 | Chen et al. | 312/334.46 |
| 7,552,899 B2 | 6/2009 | Chen et al. | |
| 7,604,308 B2 | 10/2009 | Tseng et al. | |
| 7,641,297 B2 | 1/2010 | Huang | |
| 7,648,214 B2 | 1/2010 | Chen et al. | |
| 7,694,926 B2 | 4/2010 | Allen et al. | |
| 7,726,755 B2 | 6/2010 | Peng et al. | |
| 7,731,142 B2 | 6/2010 | Chen et al. | |
| 7,798,582 B2 | 9/2010 | Yu et al. | |
| 7,967,399 B1 | 6/2011 | Baiza et al. | |
| 7,992,950 B2 | 8/2011 | Lauchner | |
| 8,104,626 B2 | 1/2012 | Huang et al. | |
| 8,272,783 B2 | 9/2012 | Mochizuki et al. | |
| 8,317,278 B2 | 11/2012 | Enos | |
| 8,353,494 B2 | 1/2013 | Peng et al. | |
| 8,371,454 B2 | 2/2013 | Chen et al. | |
| 8,403,432 B2 | 3/2013 | Chen et al. | |
| 8,534,775 B1 | 9/2013 | Liang | |
| 8,602,225 B2 | 12/2013 | Lin et al. | |
| 2001/0017760 A1 | 8/2001 | Baertsoen | |
| 2001/0035704 A1 | 11/2001 | Dierbeck | |
| 2001/0037985 A1 * | 11/2001 | Varghese et al. | 211/26 |
| 2001/0040203 A1 | 11/2001 | Brock et al. | |
| 2002/0084735 A1 * | 7/2002 | Liang et al. | 312/334.46 |
| 2002/0089272 A1 * | 7/2002 | Liang et al. | 312/333 |
| 2002/0158556 A1 * | 10/2002 | Cheng | 312/333 |
| 2003/0034720 A1 * | 2/2003 | Milligan et al. | 312/334.44 |
| 2003/0042831 A1 * | 3/2003 | Le et al. | 312/334.44 |
| 2004/0056572 A1 | 3/2004 | Chen et al. | |
| 2004/0120106 A1 | 6/2004 | Searby et al. | |
| 2004/0239220 A1 * | 12/2004 | Yang | 312/334.44 |
| 2005/0017614 A1 * | 1/2005 | Cirocco et al. | |
| 2005/0029913 A1 * | 2/2005 | He | 312/334.44 |
| 2005/0269922 A1 * | 12/2005 | Lai | 312/334.46 |
| 2006/0152115 A1 | 7/2006 | Dubon et al. | |
| 2006/0290245 A1 * | 12/2006 | Hidaka | 312/223.1 |
| 2007/0164644 A1 * | 7/2007 | Hwang et al. | 312/333 |
| 2008/0073469 A1 | 3/2008 | Mushan et al. | |
| 2008/0122333 A1 | 5/2008 | Tseng et al. | |
| 2009/0096340 A1 | 4/2009 | Chen et al. | |
| 2009/0250421 A1 | 10/2009 | Wang et al. | |
| 2011/0135227 A1 | 6/2011 | Chen et al. | |
| 2012/0292274 A1 | 11/2012 | Lin et al. | |
| 2013/0026113 A1 | 1/2013 | Fan et al. | |
| 2013/0056432 A1 | 3/2013 | Lin et al. | |
| 2014/0339973 A1 * | 11/2014 | Fan et al. | 312/333 |

* cited by examiner

SLIDE ASSEMBLY

INCORPORATION BY REFERENCE TO RELATED APPLICATIONS

Any and all applications identified in a priority claim in the Application Data Sheet, or any correction thereto, are hereby incorporated by reference herein and made a part of the present disclosure.

BACKGROUND

1. Field

The present invention generally relates to slide assemblies. In particular, the present invention relates to slide assemblies having a relatively small cross-sectional size, which are suitable for use in computer server rack applications, among others.

2. Description of the Related Art

Slide assemblies are often used to support a computer server or keyboard-video-monitor (KVM) within an enclosure or rack. The slide assembly permits the server or KVM to be extended from the rack to promote access to the server or KVM for use, maintenance, replacement or the like. The server enclosure or rack typically includes a vertical support rails at each corner. A pair of slide assemblies is mounted to the vertical support rails on opposing sides of the enclosure. The pair of slide assemblies movably supports opposing sides of a computer server or KVM.

The vertical support rails of the server rack typically include a plurality of openings, or mounting holes, spaced along the height of the support rail, which permit the slide assemblies to be coupled to the vertical support rails at any of a number of possible locations. Typically, a bracket will be connected to each end of the slide assembly and act as an interface between the slide assembly and the vertical support rails of the rack.

Although slide assemblies have been in use for a significant period of time, there is a demand for continued improvement in the design and operation of slide assemblies, especially in slide assemblies intended for use in computer server, KVM or other electronic equipment applications. For example, there is a constant push to reduce the cross-sectional size of the slide assemblies, while retaining functionality (including load-carrying capacity) or even improving the functionality of the slide assemblies.

SUMMARY

An embodiment is a slide assembly, including an outer slide segment having a first bearing surface and a second bearing surface. The outer slide segment includes a plurality of rollers separated into an upper row and a lower row. An intermediate slide segment is telescopically engaged with the outer slide segment and supported by the plurality of rollers of the outer slide segment. The intermediate slide segment includes a first C-shaped member and a second C-shaped member secured to one another in a back-to-back orientation. The plurality of rollers of the outer slide segment engages the first C-shaped member. An inner slide segment is telescopically engaged with the intermediate slide segment. The inner slide segment is a mirror image of the outer slide segment. The inner slide segment includes a plurality of rollers separated into an upper row and a lower row. The plurality of rollers contact the second C-shaped member of the intermediate slide segment to transfer the load applied to the slide assembly between the inner slide segment and the intermediate slide segment.

In some arrangements, a first lock secures the intermediate slide segment in an open position relative to the outer slide segment, wherein the first lock comprises a latch carried by the intermediate slide segment and which engages a stop of the outer slide segment, and wherein the inner slide segment moves the latch out of engagement with the stop. A second lock can secure the inner slide segment in an open position relative to the intermediate slide segment, wherein the second lock comprises a lock arm carried by the inner slide segment and that engages a tab of the intermediate slide segment. A detent arrangement can be configured to secure the inner slide segment in a desired position relative to the intermediate slide segment and which can be overcome with the application of force to the inner slide segment. In some arrangements, the detent arrangement secures the inner slide segment in an open position and a closed position relative to the intermediate slide segment. The detent arrangement can comprise a detent latch carried by the inner slide segment and having a plurality of latch arms, each having an engagement member that engages a corresponding recess or opening of the intermediate slide segment in at least one of the open position and the closed position. In some arrangements, at least a first one of the plurality of latch arms engages the corresponding recess or opening in the open position and at least a second one of the plurality of latch arms engages the corresponding recess or opening in the closed position.

In some configurations, a mounting arrangement has a first bracket and a second bracket configured to engage a first mounting rail and a second mounting rail, respectively, of a server mounting rack, wherein the mounting arrangement defines a height that is at least twice a height of the inner, intermediate and outer slide segments. The first bracket can be positioned at a forward end of the outer slide segment and the second bracket is positioned at a rearward end of the outer slide segment. A retention latch can be associated with each of the first bracket and the second bracket and configured to secure the brackets to the respective first and second mounting rails.

An embodiment involves a slide assembly, including an outer slide segment, an intermediate slide segment telescopically engaged with the outer slide segment, and an inner slide segment telescopically engaged with the intermediate slide segment. A mounting arrangement permits the slide assembly to be mounted to mounting rails of a server rack. The mounting arrangement comprises a first bracket at a forward end of the slide assembly and a second bracket at a rearward end of the slide assembly. A position of the second bracket is adjustable in a longitudinal direction of the slide assembly to permit a length adjustment of the mounting arrangement. At least one mounting pin assembly is carried by each of the first bracket and the second bracket. Wherein the at least one mounting pin assembly comprises a support pin, a first movable pin member and a second movable pin member coaxially and movably mounted on the support pin, the first and second movable pin members movable against a biasing force to adjust the size of the mounting pin assembly into one of at least three modes to accommodate mounting rails having different mounting hole sizes or shapes.

In some arrangements, the first bracket is supported by a first channel and the second bracket is supported by a second channel, wherein the first channel and the second channel are telescopically engaged with one another. The first bracket can comprise an elongated body portion that is at least substantially the same height and length as the first channel. The second bracket can be unitarily formed with the second channel.

In some arrangements, a retention latch is associated with each of the first bracket and the second bracket and having a locked position configured to secure the brackets to the respective first and second mounting rails. The retention latch can define an engagement surface and a ramped surface, the ramped surface configured to bias the retention latch away from a locked position and, in the locked position, the engagement surface configured to contact the associated mounting rail to inhibit disengagement of the bracket from the associated mounting rail.

In some arrangements, the retention latch defines a grip tab to facilitate manual movement of the retention latch to an unlocked position. An associated one of the first and second brackets can define a window aligned with and permitting access to the grip tab.

In some arrangements, the retention latch includes a resilient portion configured to bias the retention latch toward the locked position. The retention latch can be constructed from a single piece of material.

BRIEF DESCRIPTION OF THE DRAWINGS

These and other features, aspects and advantages of the present slide assemblies are described herein with reference to drawings of certain preferred embodiments, which are provided for the purpose of illustration and not limitation. The drawings contain eighteen (18) figures.

DETAILED DESCRIPTION OF THE PREFERRED EMBODIMENTS

Preferred embodiments of the compact slide assemblies include between two and four (or possibly more) slide segments telescopically engaged with one another to move between a closed position and an open position. The slide segments may also be referred to as portions or channels herein. However, the use of the term "channel" does not imply any particular cross-sectional shape. The segments or channels may be any suitable shape to permit telescopic engagement between the segments. Certain preferred cross-sectional shapes are illustrated and/or described herein.

Figure 1:
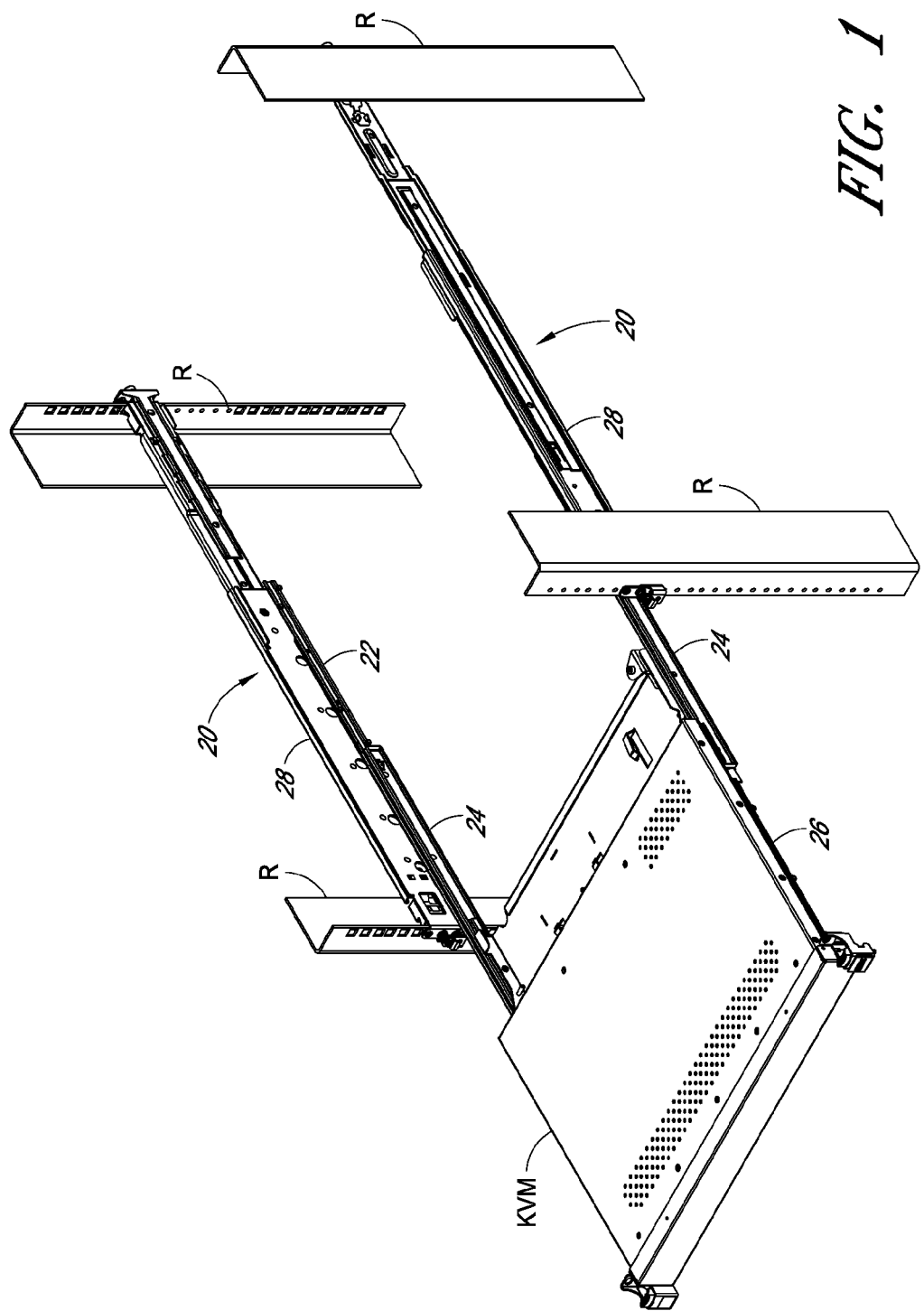
FIG. 1 is a perspective view of a KVM mounted to support rails of a server rack by left and right slide assemblies (from the perspective of an observer facing the server rack).
Figure 2:
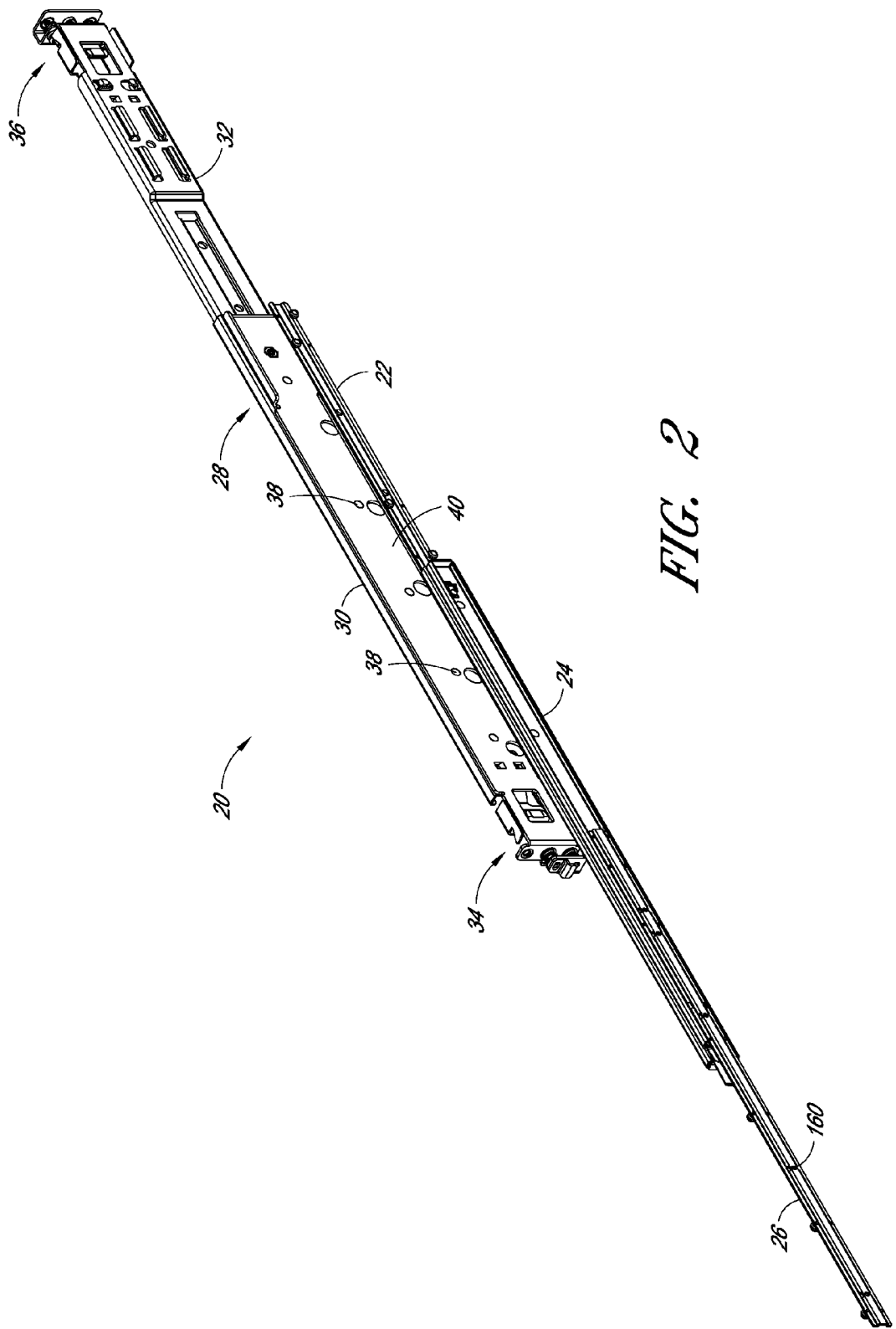
FIG. 2 is a perspective view of a first or inboard side of the left slide assembly in an open position.
Figure 3:
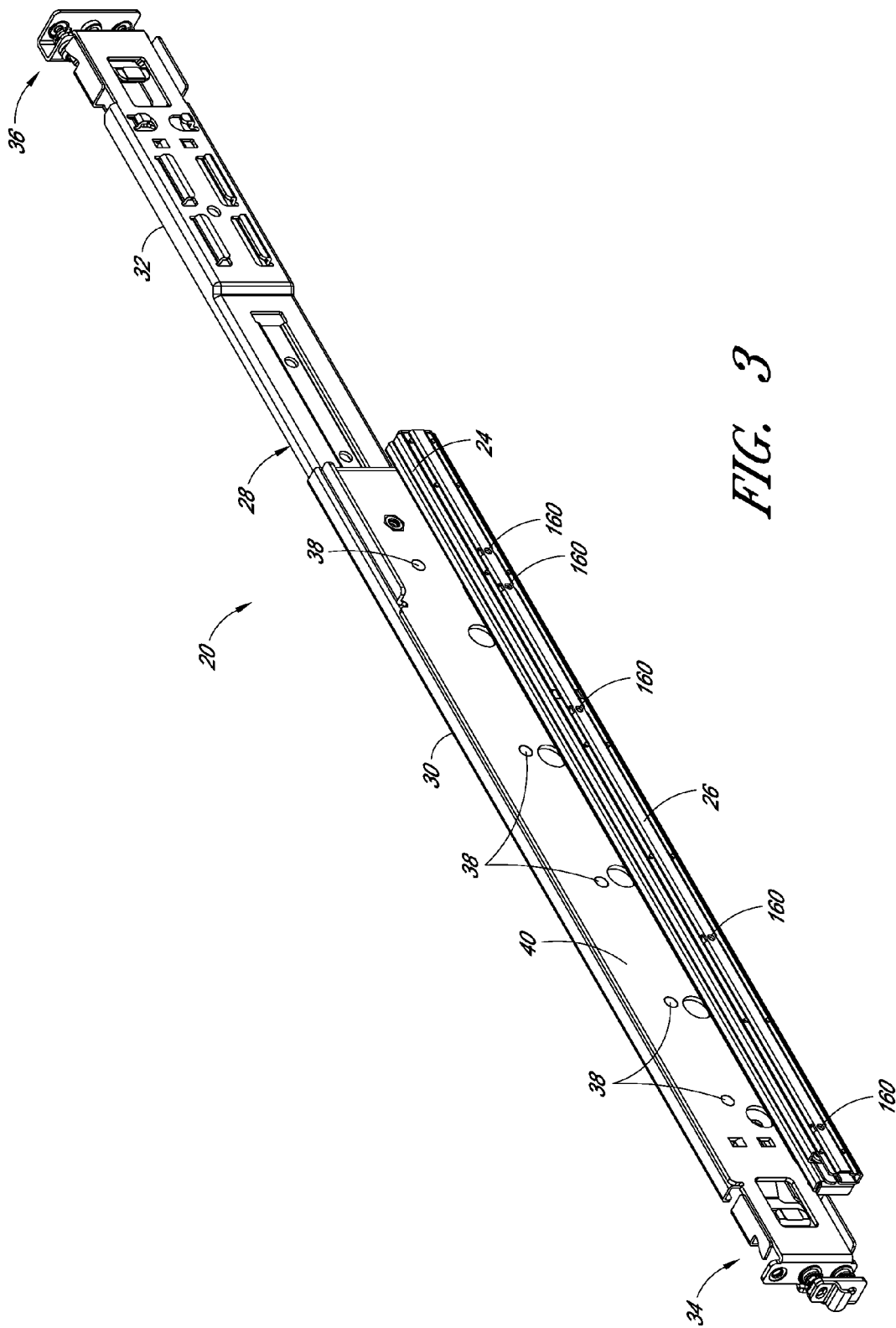
FIG. 3 is a perspective view of the inboard side of the left slide assembly of FIG. 1 in a closed position.
Figure 4:
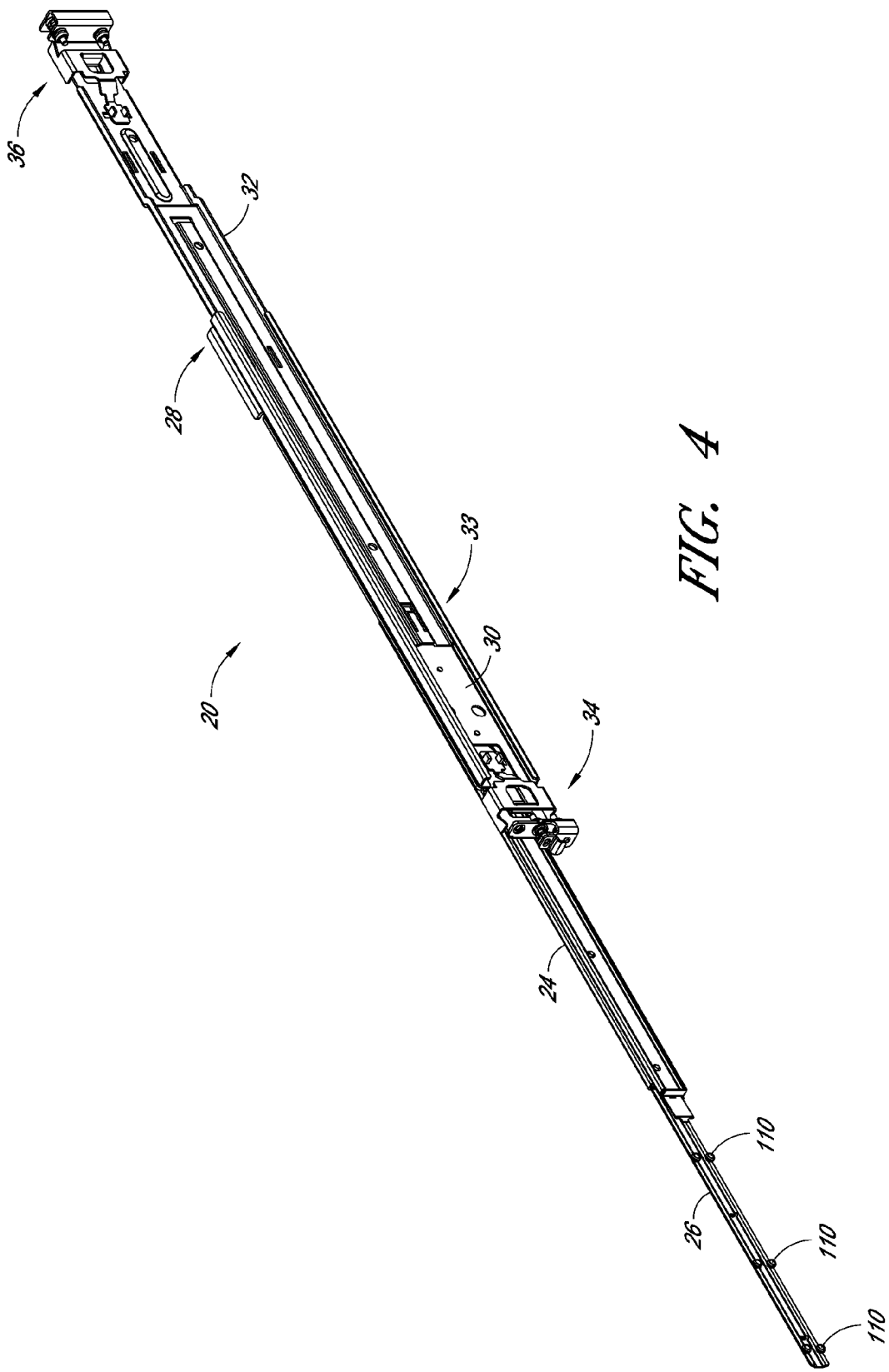
FIG. 4 is a perspective view of a second or outboard side of the right slide assembly of FIG. 1 in an open position.
Figure 5:
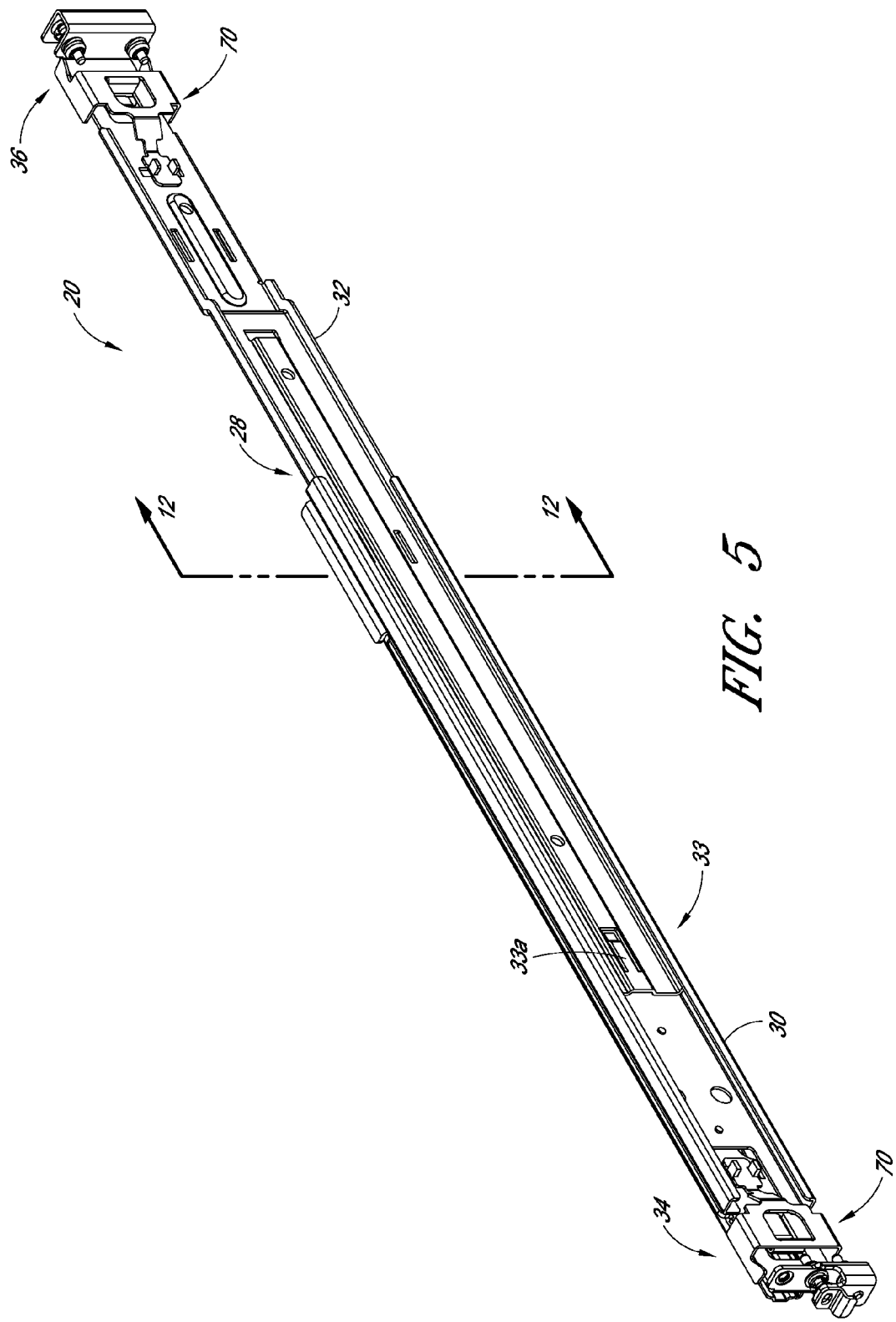
FIG. 5 is a perspective view of the outboard side of the right slide assembly of FIG. 1 in a closed position.

Typically, one or more slide assemblies permit one object to be supported and moved relative to another object. One object is often stationary, such as an enclosure or rack, and the other object, such as a drawer or an electronic component (e.g., a computer server or KVM), is movable between an open and closed position relative to the stationary object. Often, as illustrated in FIG. 1, a slide assembly is provided on each side of the supported object. For convenience, the slide assembly is referred to as having an outboard side and an inboard side. The outboard side typically faces outwardly from the supported object and the inboard side faces toward the supported object. Also, the slide assembly is referred to as having a forward end and a rearward end. The slide assembly opens from the forward end and moves away from the rearward end. These, and other relative terms (top, bottom, above, below, etc.) are used for convenience and with respect to the particular orientation shown in the referenced figures and are not intended to be limiting, unless otherwise indicated or made clear from the particular context. Thus, the slide assemblies can also be used in other orientations, or adapted for use in orientations other than those illustrated.

The preferred embodiments disclosed herein are well-suited for use in movably supporting computer servers or KVMs relative to a server rack. However, the disclosed embodiments can also be used in, or adapted for use in, other applications as well. Accordingly, any reference to the rack, KVM or server herein can also refer more generally to other stationary and movable objects in other applications of the slide assembly. Generally, a KVM is a rack-mount unit that, when pulled out, allows user access to a keyboard, a monitor, and a power supply, or switch, or both. The monitor is usually flipped up so a user can see it, and the keyboard is accessible to a user standing in front of the rack or enclosure. The KVMs are typically used as input control systems to the rest of the electronics mounted in the rack, or even neighboring racks whose systems may be interconnected. In particular, the preferred slide assemblies have a relatively small cross-sectional size such that the space available for the computer server or KVM can be maximized. In a KVM application, it is usually preferable to minimize the height of the slide assembly. In contrast, in a computer server application, it is usually preferable to minimize the width of the slide assembly. For example, in some embodiments, the cross-sectional height of the slide assembly (not including the mounting brackets) is less than about 1.5 inches, less than about 1 inch and, preferably, is about 0.74 inches (or any value within the aforementioned range). Advantageously, a height of about 0.74 inches is about ½U (unit) of height. The slide assembly may have a cross-sectional width (not including the mounting brackets) of less than about 1 inch and, preferably, about 0.6 inches. In addition, the slide assemblies are capable of supporting the load applied by the servers or KVMs, and often additional loading, while still maintaining smooth extension and retraction of the slide assembly. For example, in some embodiments (including an embodiment having a height of about 0.74 inches), the slide assembly can accommodate a static load of, in some cases, about 120 lbs. in an open position and, thereafter, is functional with a cyclic working load of up to about 15-20 lbs. In addition, in some embodiments (including an embodiment having a height of about 0.74 inches), the slide assembly can accommodate, separately, a static front, side (lateral) load of about 56 lbs. and a static front, corner (vertical) load in an open position and, thereafter, is functional with a cyclic working load of up to about 15-20 lbs. In some configurations, the slide assemblies can pass the applicable test standards (e.g., UL 60950-12$^{nd}$ Edition) for the desired application. Such an overload capability is highly advantageous because in normal use such slide assemblies often encounter a load beyond the normal operational or cyclic working load rating. Accordingly, preferred embodiments can remain functional after experiencing static loads well beyond the operational load rating.

FIGS. 1-14 illustrate a pair of compact slide assemblies 20 having certain features, aspects and advantages of the preferred embodiments. In the illustrated arrangement, the slide assemblies 20 include three slide segments: an outer slide segment 22, an intermediate slide segment 24 and an inner slide segment 26 telescopically engaged with one another and movable between a closed position and an open position. However, in other arrangements, the slide assemblies 20 may include only two segments, or more than three segments. In some configurations, as discussed below, the slide assemblies 20 can include one or more locking mechanisms that permit the slide assembly 20 to be selectively locked in one or more of a closed position, an open position, and a partially open or closed position, among others. In addition, the slide assemblies 20 may include rolling elements (e.g., bearings or rollers) interposed between some or all of the slide segments 22, 24, 26 to facilitate smooth relative movement therebetween. Alternatively, some or all of the segments of the slide assemblies 20 may include solid bearing surfaces that slide relative to one another as the slide assembly 20 is extended and retracted.

The slide assembly 20 is configured to be secured to a stationary object, which can be a computer server rack, for example. Typically, the computer server rack includes vertical mounting rails R at each corner. Each of the slide assemblies 20 includes a mounting arrangement 28 that permits the slide assembly 20 to be secured to the mounting rails R of a server rack. Preferably, the mounting arrangement 28 is attached to the outer slide segment 22 such that the outer slide segment 22 is connected to the server rack and the inner slide segment 26 carries the keyboard-video-monitor (KVM). However, in other arrangements, the inner segment 26 may be connected to the stationary object and the outer slide segment may be connected to the movable object. Moreover, the slide assembly 20 may be connected to the server rack in any suitable manner, including tool-less attachment or attachments utilizing fasteners that require tools to assemble or disassemble. In the arrangement illustrated in FIG. 1, a slide assembly 20 is provided on each of the right-hand and left-hand sides of the KVM from the perspective of an observer facing the forward end of the keyboard-video-monitor (KVM). For convenience, the slide assemblies 20 are referred to herein as the right slide assembly and the left slide assembly. Preferably, the right and left slide assemblies are mirror images of each other. Therefore, any feature or component of one slide assembly can be assumed to be present in the other slide assembly in a mirrored arrangement, unless specified otherwise.

The illustrated mounting arrangement 28 permits tool-less attachment of the slide assembly 20 to the mounting rails of the computer server rack. The illustrated tool-less mounting arrangement 28 not only permits the slide assembly 20 to be coupled to the server rack, but also provides a substantial amount of length adjustment such that the mounting arrangement 28 can accommodate server racks that vary widely in depth. In particular, the mounting arrangement 28 includes a first channel 30 and a second channel 32 telescopically engaged with one another such that the overall length defined by the first channel 30 and second channel 32 can be adjusted. One of the channels 30, 32 is connected to the outer slide segment 22 and the other channel 30, 32 is movable relative to the outer slide segment 22. In the illustrated arrangement, the first channel 30 is secured to the outer slide segment 22 and is positioned forward of the second channel 32. The second channel 32 is adjustable relative to the first channel 30 and the outer slide segment 22. However, in other embodiments, this arrangement could be reversed.

In the illustrated arrangement, the first channel 30 has a length that is substantially equal to a length of the outer slide segment 22 (which may equal a length of the slide assembly 20) and defines a C-shaped cross-section. The second channel 32 also defines a length that is substantially equal to the length of the first channel 30 and the outer slide segment 22. The second channel 32 is in sliding or telescopic engagement within the space defined by the C-shaped cross-section of the first channel 30. In some configurations, one or both of the first channel 30 and the second channel 32 defines a height $H_C$ that is significantly greater than a height $H_S$ of some or all of the segments 22, 24, 26 of the slide assembly 20. For example, the height $H_C$ can be about 2-3 times greater than the height $H_S$ or about 2.5 times greater than the height $H_S$.

Figure 6:
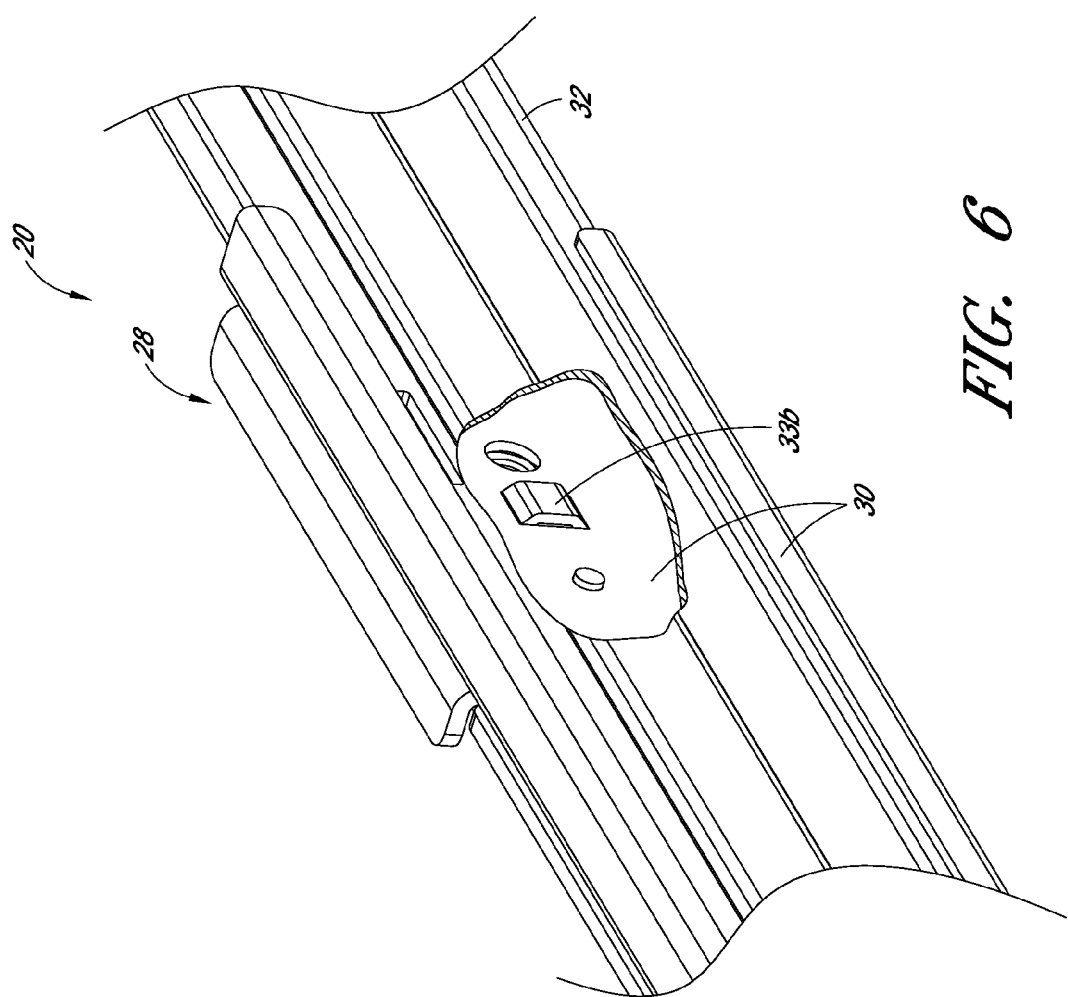
FIG. 6 is an enlarged view of a portion of the outboard side of the right slide assembly of FIG. 5 with a portion cut-away to show underlying structure.

The first channel 30 and the second channel 32 can have a lock assembly or stop assembly 33 (FIGS. 4-6) that inhibits or prevents unintentional or undesirable disengagement of the first channel 30 and second channel 32. In particular, one of the first channel 30 and the second channel 32 can define a latch or lock arm 33a and the other of the first channel 30 and the second channel 32 can define an engagement surface or stop 33b (FIG. 6). The lock arm 33a is shaped to deflect out of the way of the stop 33b upon assembly of the first channel 30 and the second channel 32, but contact the stop 33b upon extension movement and inhibit separation of the first channel 30 and the second channel 32. The lock assembly 33 can be positioned at any desirable location on the first and second channels 30 and 32, but preferably is positioned near respective rearward and forward ends thereof to permit substantial or near-complete extension of the first channel 30 and the second channel 32. In the illustrated arrangement, the lock arm 33a is connected to or defined by the second channel 32 and the stop 33b is connected to or defined by the first channel 30.

The mounting arrangement 28 includes a first coupling or bracket 34 at a first or forward end and a second coupling or bracket 36 at a second or rearward end. The illustrated brackets 34, 36 permit tool-less connection of the mounting arrangement 28 to the server rack. The brackets 34, 36 can be coupled to the mounting arrangement 28 in any suitable manner. In the illustrated arrangement, the bracket 34 is a separate component coupled to the first channel 30 by one or more suitable fasteners, such as rivets 38, for example. The bracket 34 includes an elongated body portion 40 that is coupled to a vertical wall of the first channel 30. Preferably, the elongated body portion 40 overlaps a substantial portion of the vertical wall of the first channel 30. That is, in some arrangements, the elongated body portion 40 preferably is of substantially the same height and length as the vertical wall of the first channel 30. Such an arrangement increases the overall strength and rigidity of the mounting arrangement 28. The bracket 36 preferably is unitary with, or formed from the material of, the second channel 32 and is positioned at a rearward end of the second channel 32. However, the bracket 36 could be a separate component coupled to the second channel 32.

Each of the illustrated brackets 34, 36 includes a laterally-projecting mount portion 42, which carries one or more engagement members 44, such as engagement pins or pin assemblies. Preferably, two engagement pin assemblies 44 are provided on each of the forward bracket 34 and the rearward bracket 36; however, other numbers of engagement members 44 are also possible. The engagement members 44 are configured to engage mounting holes in the vertical rails of the computer server rack, which can be adjacent mounting holes or mounting holes that are spaced from one another by one or more intervening mounting holes. The illustrated engagement members 44 are generally cylindrical in shape. However, other suitable shapes may also be used. The shape of the engagement members 44 may be configured to match the shape of the server rack mounting holes or may simply be configured to be capable of engagement with the mounting holes (e.g., circular pin in a rectangular hole).

The illustrated mount portions 42 are substantially U-shaped in horizontal cross-section or when viewed from above and each includes a first lateral wall or flange 46 and a second lateral wall or flange 48 coupled in a longitudinally spaced-apart orientation by a side wall 50. The flanges 46 and 48 can have different heights, such as the flange 46 being smaller than the flange 48, for example. The illustrated engagement members 44 are multi-component pin assemblies having two or more pin portions, one of which can be selectively engaged with a server rack mounting hole. In particular, the illustrated pin assemblies 44 include two or more coaxial pin portions that can move relative to one another such that one of the pin portions can engage the server rack mounting hole.

The illustrated pin assemblies 44 include a first or inner pin member 52 and a second or outer pin member 54 coaxially mounted on the inner pin member 52. Both the inner pin member 52 and the outer pin member 54 are mounted on a support pin 56. The support pin 56 is supported by the first flange 46 and extends through an aligned opening 58 in the second flange 48. The inner pin member 52 and outer pin member 54, at least initially, are positioned at least partially outside (e.g., rearward) of the space defined between the first flange 46 and the second flange 48 and are movable relative to the support pin 56 and one another along an axis of the support pin 56 toward (and, preferably, into) the space between the first flange 46 and the second flange 48. Preferably, each of the inner pin member 52 and the outer pin member 54 are biased away from the space between the first flange 46 and the second flange 48 by one or more biasing members. In the illustrated arrangement, each of the inner pin member 52 and the outer pin member 54 have a corresponding biasing member 60 and 62. One or both of the inner pin member 53 and the outer pin member 54 can be moved out of the way by the area of a server rack mounting rail R surrounding a mounting hole against the biasing force of one or both of the biasing member 60 and 62, leaving an appropriate one of the support pin 56, inner pin member 52 or outer pin member 54 to engage the mounting hole of the server rack mounting rail. With such an arrangement, the brackets 34, 36 can automatically adjust for a specific hole size or shape of the server rack mounting rail and, preferably, for at least three different hole sizes and/or types.

Preferably, each of the brackets 34, 36 also includes a latch 70 that secures the bracket 34, 36 to the server rack. The latch 70 is movable relative to the bracket body 38 to move out of the way upon contact with the server rack to permit the pin assemblies 44 to engage the mounting holes of the server rack. Once the pin assemblies 44 are engaged with the mounting holes of the server rack the latch 70 returns to secure the bracket 34, 36 in place. The latch 70 can be of any suitable arrangement; however, in the illustrated arrangement, the latch 70 includes a resilient arm portion 72 that biases the latch 70 toward the closed position. Preferably, the latch 70 includes an engagement portion that has an upper arm 74 and a lower arm 76 interconnected by a preferably vertically and longitudinally-extending connecting portion 78.

Each of the upper arm 74 and the lower arm 76 defines a ramped surface 80 and an engagement surface 82 that extends in a lateral direction. The ramped surface 80 is angled such that a point closer to the pin assemblies 44 is further outboard relative to a point further from the pin assemblies 44. Accordingly, when the ramped surface 80 contacts the inner surface of a mounting rail of a server rack and is moved toward the pin assemblies 44, the latch 70 moves further from the closed position against the biasing force of the resilient arm portion 72. Once the pin assemblies 44 engage the mounting holes of the server rack, the latch 70 can return to the closed position such that the mounting rail is captured between the engagement surface 82 of the latch 70 and the second flange 48 of the bracket 34 or 36.

Figure 7:
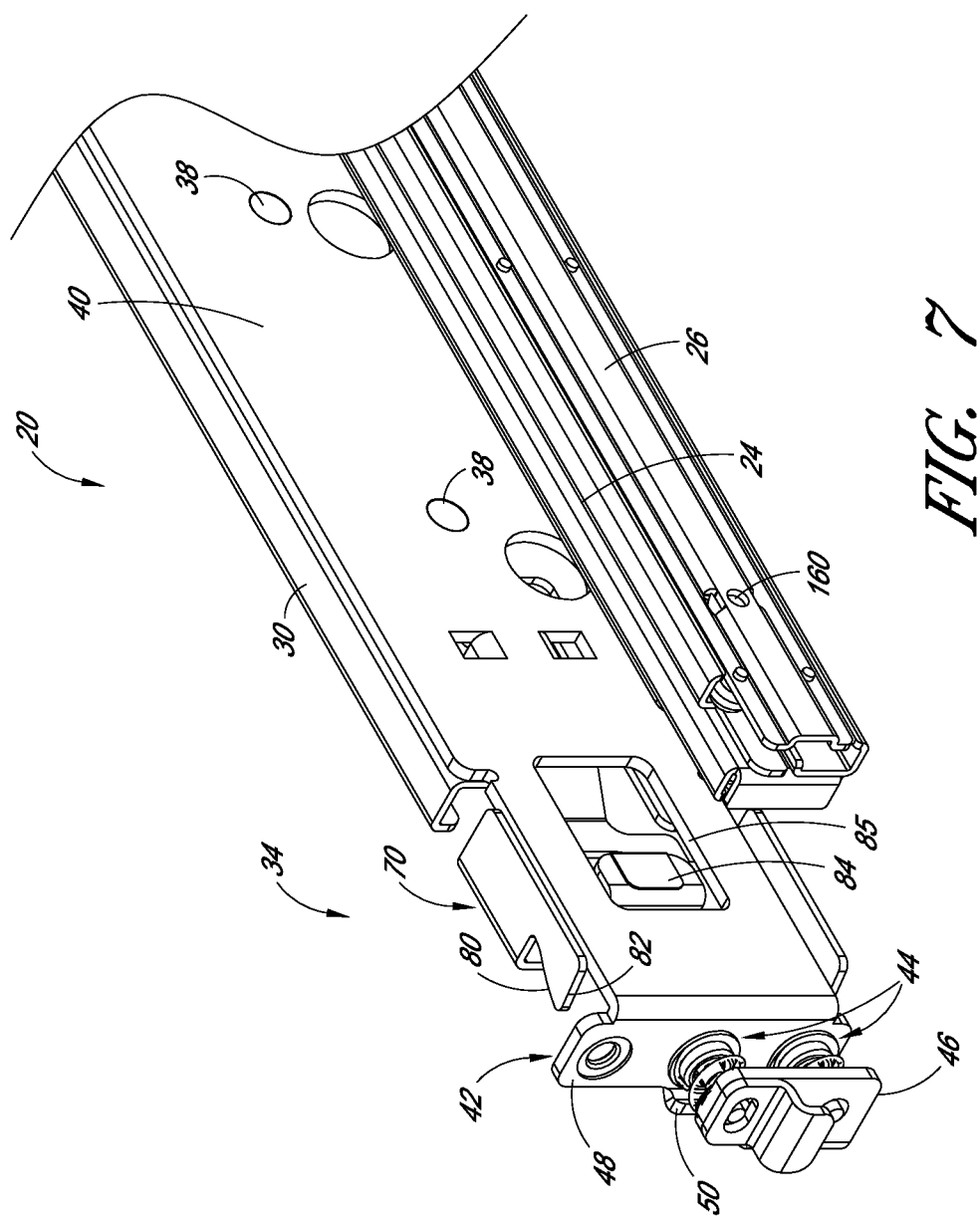
FIG. 7 is a perspective view of a forward end of the left slide assembly illustrating a forward mounting bracket.
Figure 8:
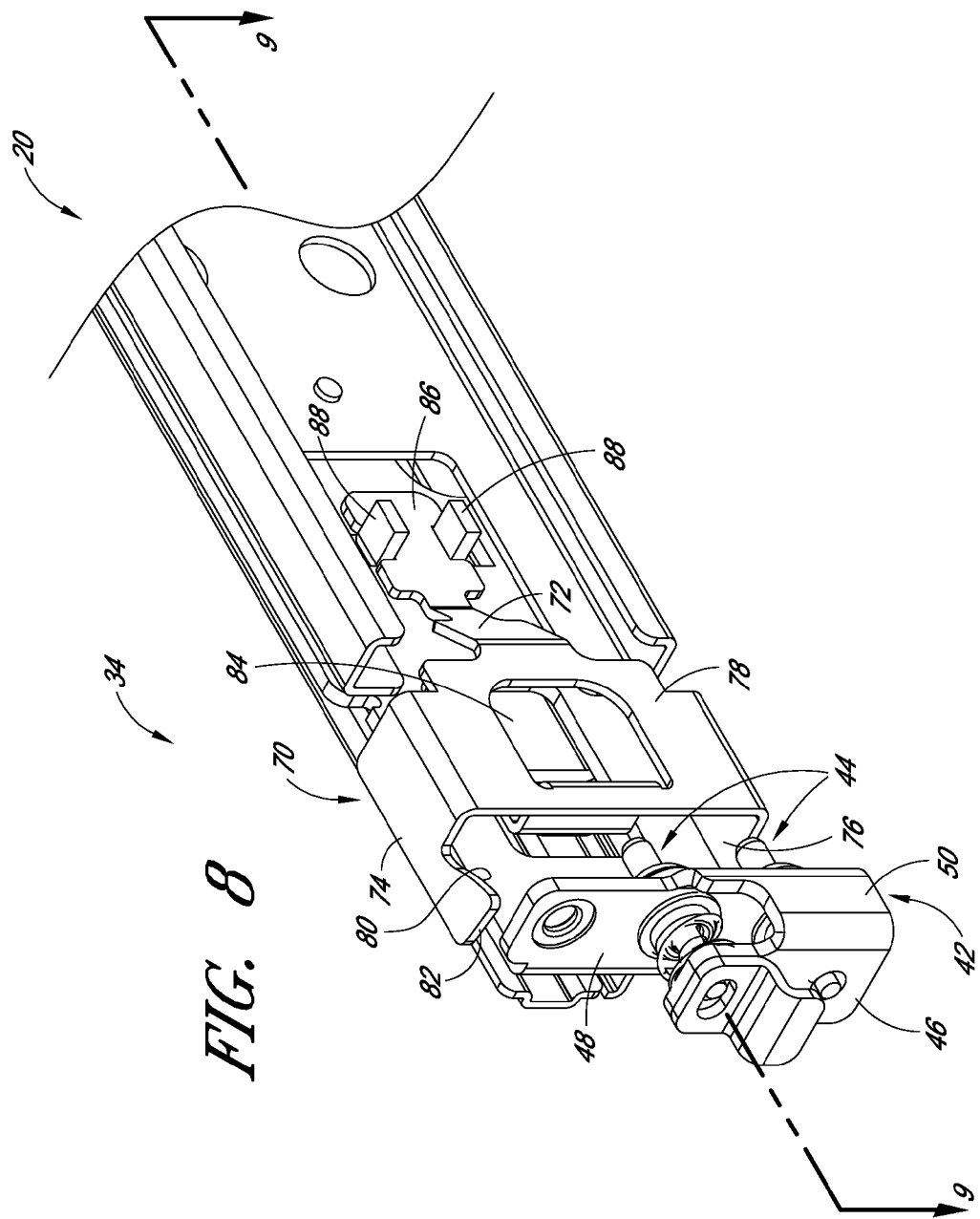
FIG. 8 is a perspective view of a forward end of the right slide assembly illustrating a forward mounting bracket.
Figure 9:
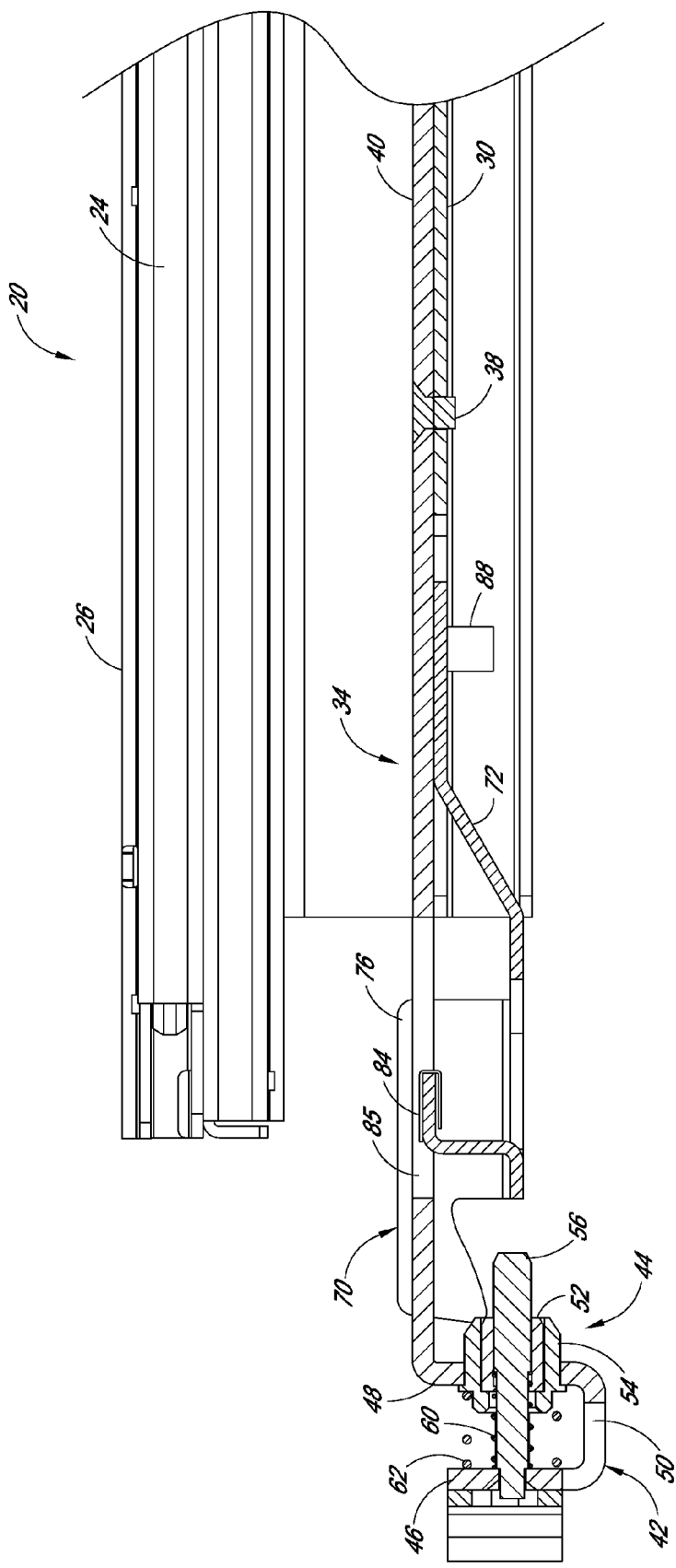
FIG. 9 is a longitudinal cross-sectional view of the forward end of the right slide assembly taken along the line 9-9 of FIG. 8.
Figure 10:
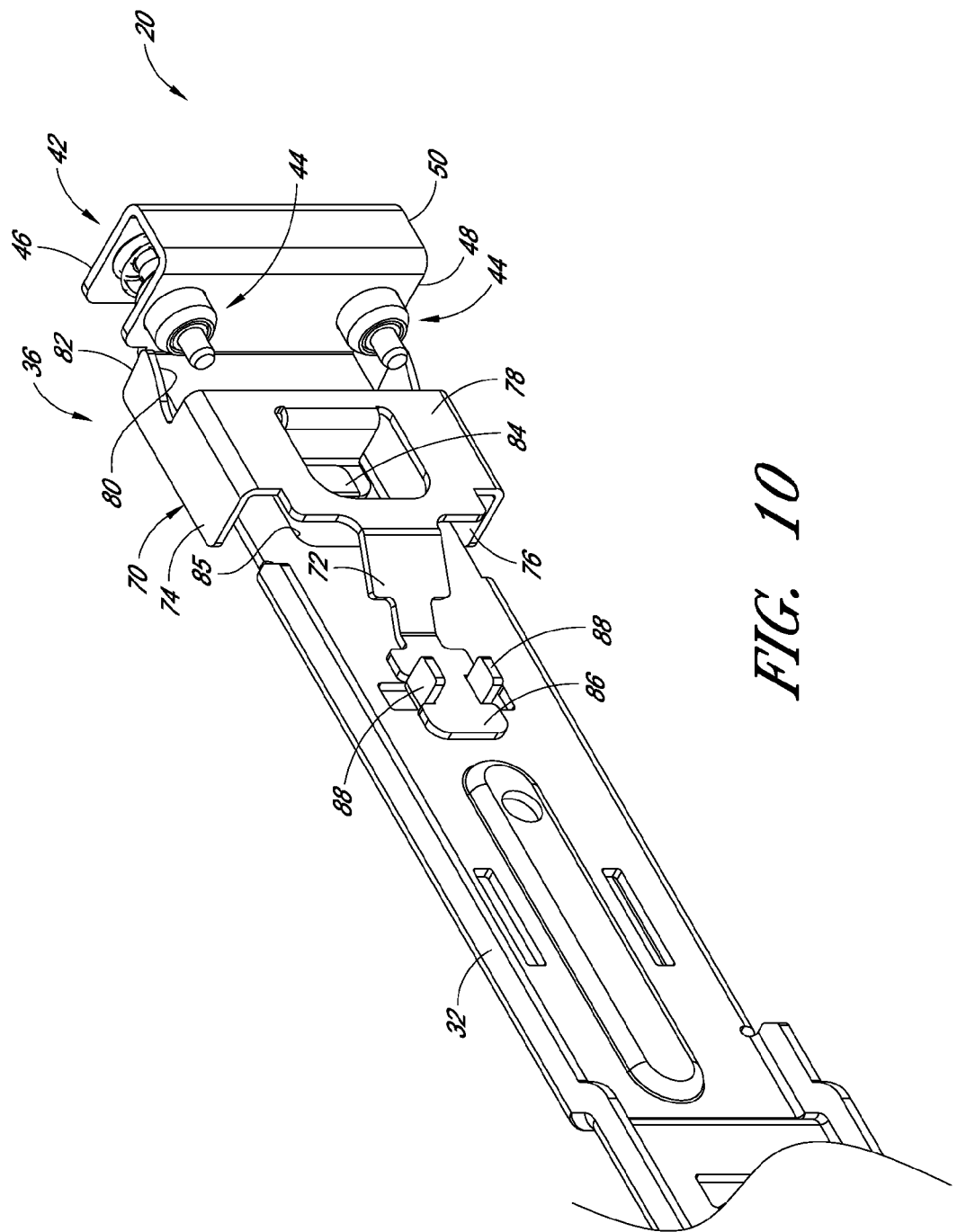
FIG. 10 is a perspective view of a rearward end of the right slide assembly of FIG. 1.
Figure 11:
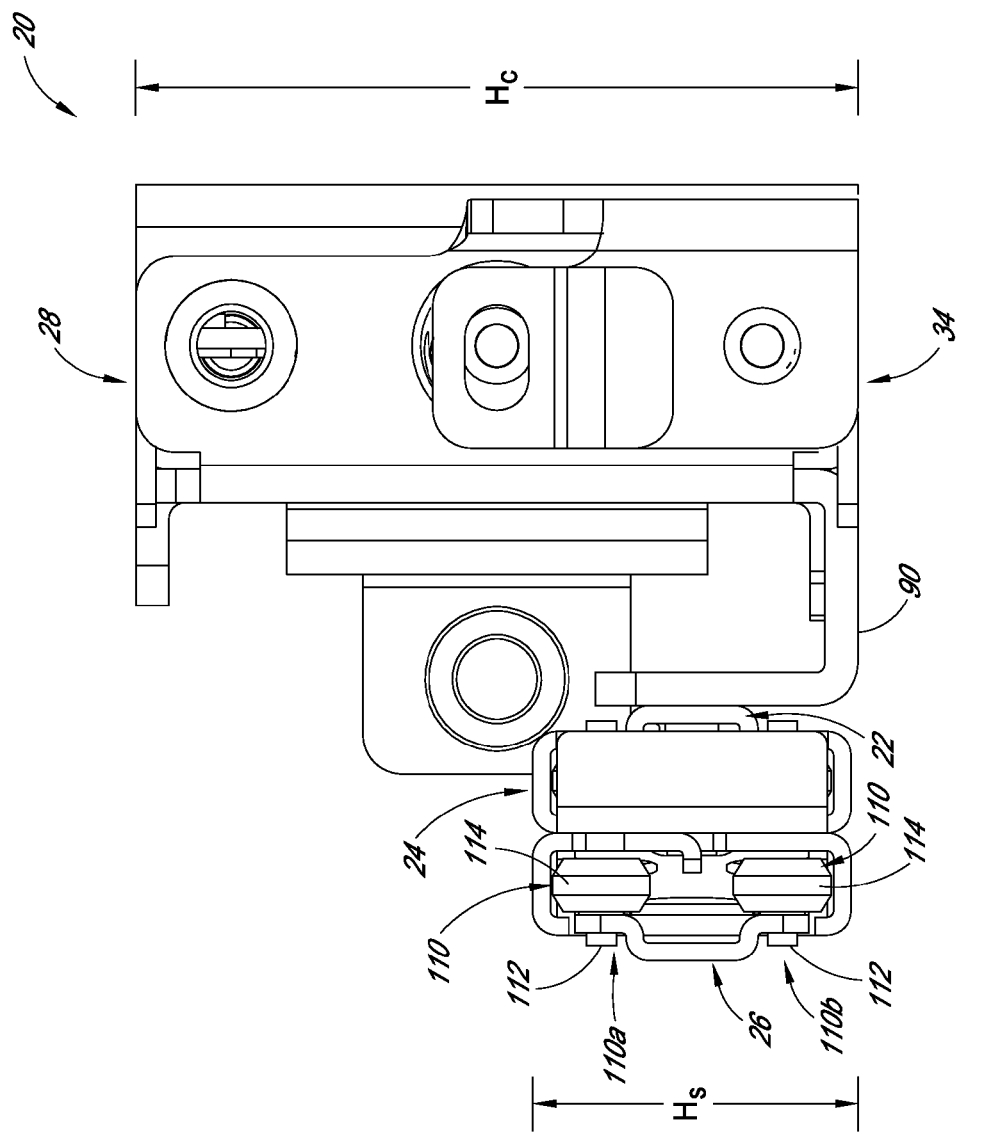
FIG. 11 is a front view of the right slide assembly of FIG. 1.
Figure 12:
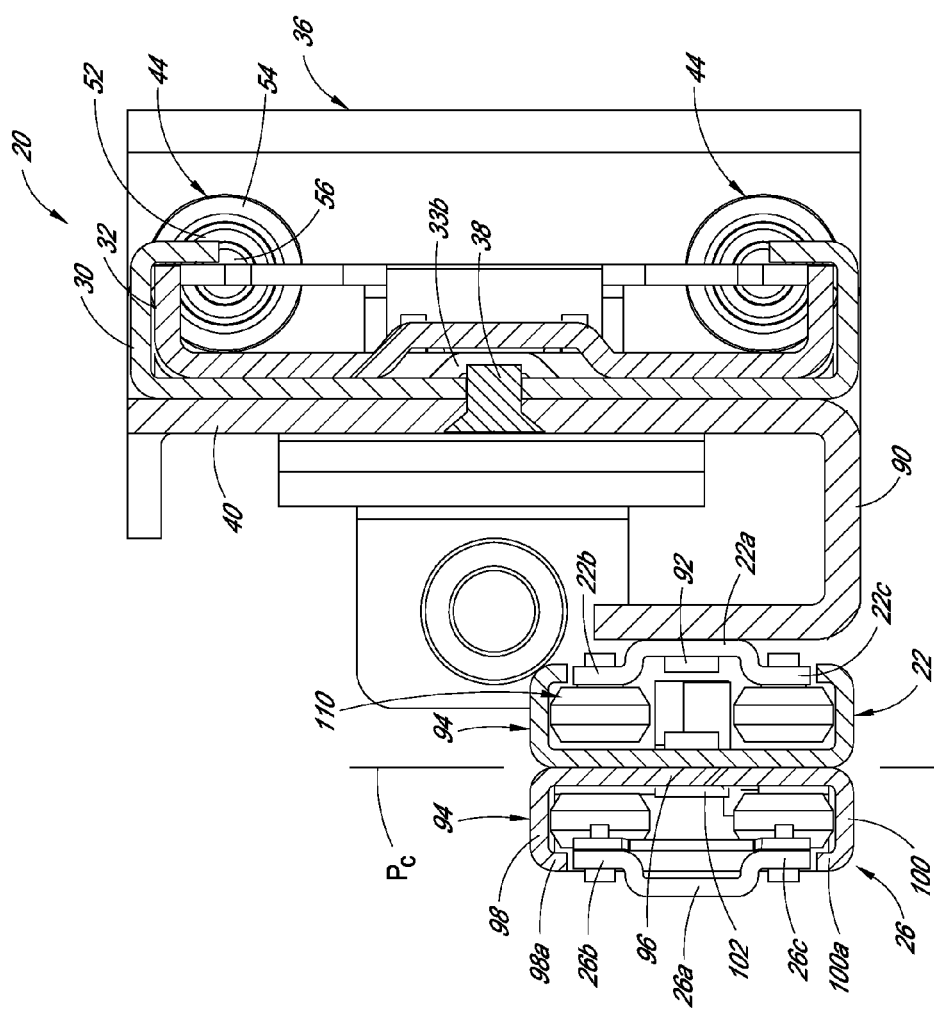
FIG. 12 is a lateral cross-sectional view of the right slide assembly of FIG. 1 taken along line 12-12 of FIG. 5.
Figure 13:
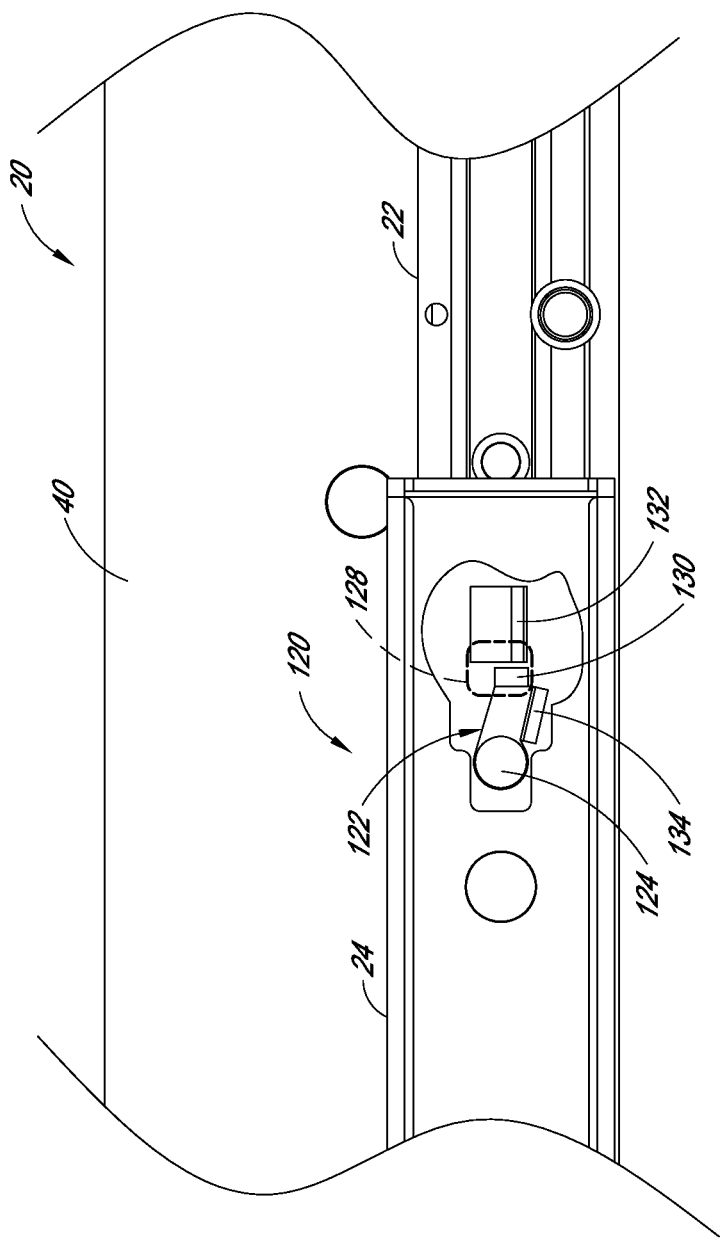
FIG. 13 is a side view of a portion of the left slide assembly of FIG. 1, which shows a lock arrangement that secures the intermediate slide segment into an open position relative to the outer slide segment. Portions of the intermediate slide segment are cut-away to show underlying structure.
Figure 14:
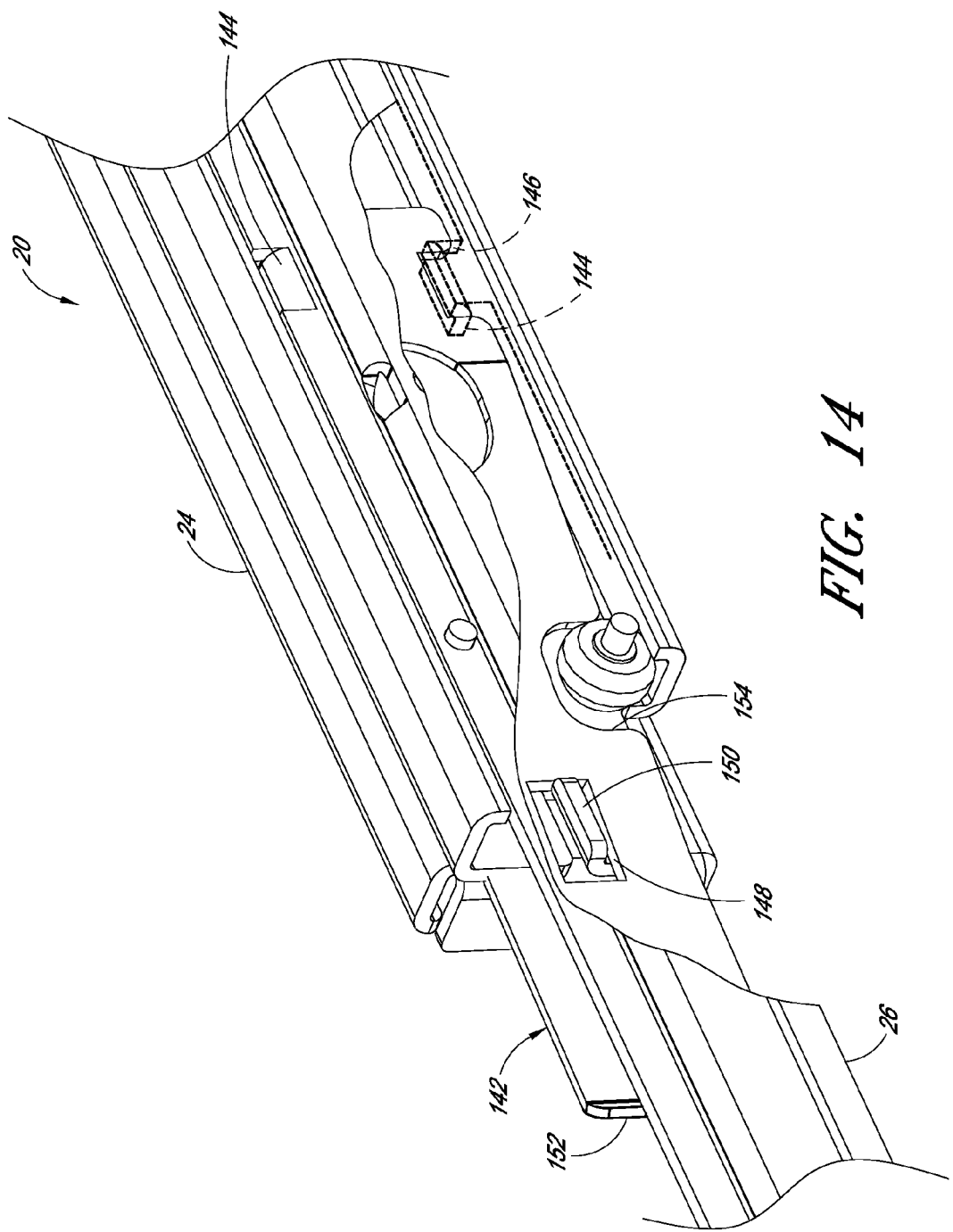
FIG. 14 is a perspective view of a portion of the left slide assembly of FIG. 1, which shows a lock arrangement that secures the inner slide segment into an open position relative to an intermediate slide segment of the slide assembly. Portions of the inner slide segment are cut-away to show underlying structure.
Figure 15:
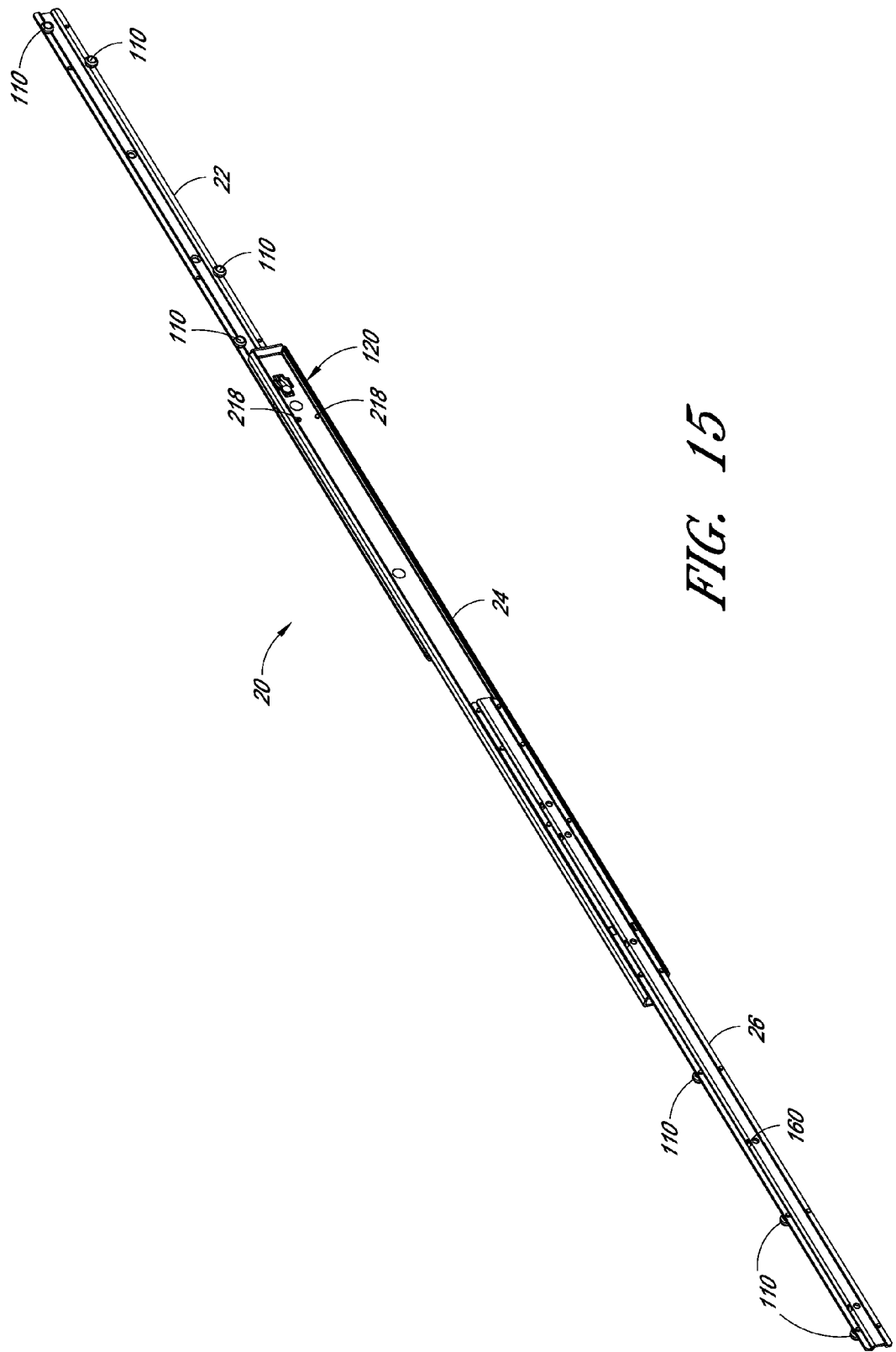
FIG. 15 is a perspective view of a modification of the slide assemblies of FIGS. 1-14 separate from a server rack and without a mounting arrangement.
Figure 16:
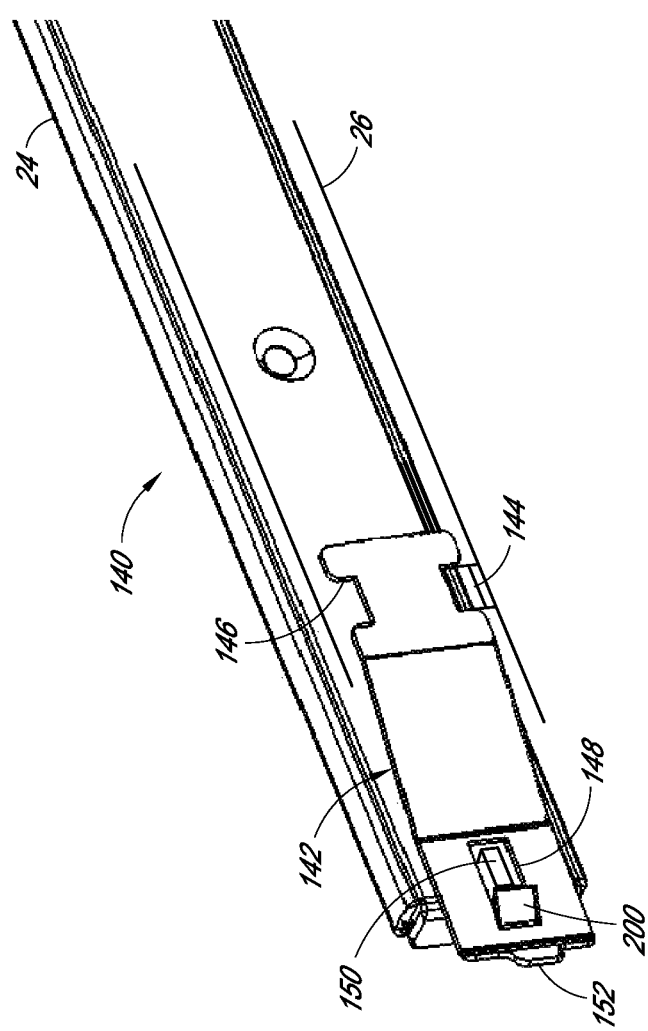
FIG. 16 is perspective view of the inner and intermediate segments of the slide assembly of FIG. 15, which shows a lock arrangement that secures the inner slide segment into an open position relative to an intermediate slide segment of the slide assembly.
Figure 17:
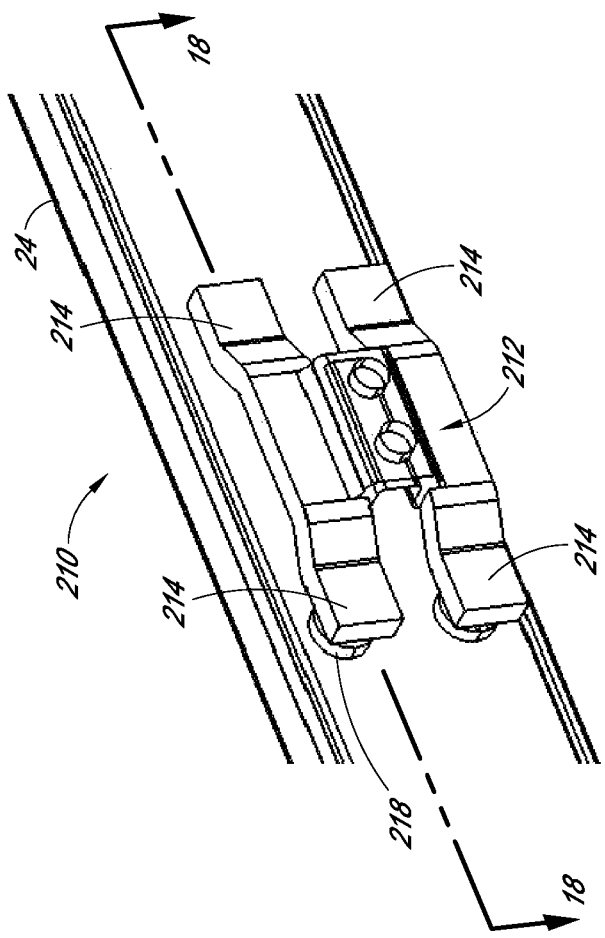
FIG. 17 is a perspective view of the intermediate slide segment and illustrating a detent arrangement carried by the inner slide segment (not shown) and which retains the inner slide segment in a desired position relative to the intermediate slide segment.
Figure 18:
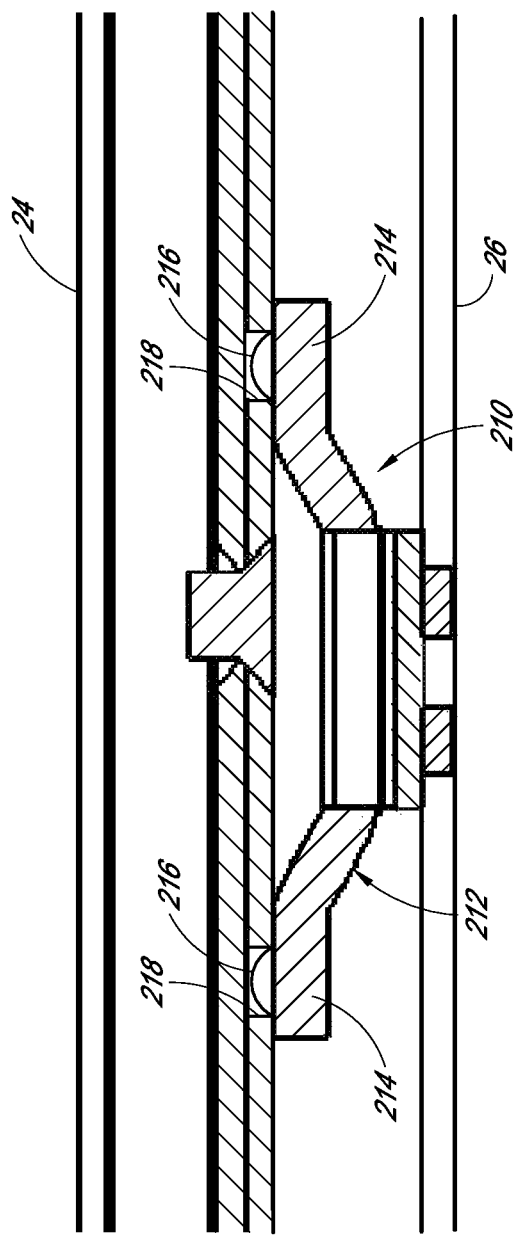
FIG. 18 is a longitudinal cross-sectional view of the detent arrangement taken along line 18-18 of FIG. 17.

In the illustrated arrangement, each latch 70 includes an actuation portion or grip tab 84 that permits a user to conveniently grasp the latch 70 to unlock the respective bracket 34 or 36. Preferably, the grip tab 84 is formed by the material of the connecting portion 78 of the latch 70 and extends in an inboard direction or in the same direction as the upper arm 74 and lower arm 76. In some configurations, the grip tab 84 is accessible from an inboard side (between the server rails R) through a window 85 in the bracket 34 and, in particular, in the elongated body portion 40 (FIG. 7). If desired, the grip tab 84 can include a touch point or grip or friction-enhancing surface or member to facilitate actuation by a user. Advantageously, these features facilitate easy assembly to and removal from the server rack.

Preferably, the latch 70 also includes an attachment portion 86 that couples the latch 70 to the bracket 34 or 36. The attachment portion 86 can be secured to the bracket 34 or 36 by any suitable arrangement, such as by one or more fasteners (e.g., rivets or screws); however, preferably the attachment portion 86 is retained by tabs 88 of the elongated body portion 40. In the illustrated arrangement, the latch 70 is of a one-piece or unitary construction and is constructed of a material having suitable resilient properties to bias the latch 70 towards the closed position and allow the latch 70 to move away from the closed position. The latch 70 can be constructed from sheet steel or another suitable material, such as a resilient plastic, for example.

As described above, the outer slide segment 22 is coupled to the mounting arrangement 28 and, more particularly, to the elongated body portion 40 of the bracket 34. In the illustrated arrangement, the elongated body portion 40 comprises a mounting flange 90 that is L-shaped in cross-section or when viewed from the front with a lower horizontal leg and a vertical leg. The outer slide segment 22 is coupled to the vertical leg of the mounting flange 90 by any suitable arrangement, such as one or more suitable fasteners 92 (e.g., rivets).

In the illustrated arrangement, the assembly of the outer slide segment 22, the intermediate segment 24 and the inner slide segment 26 is generally symmetrical about a vertical, central plane $P_C$ of the assembly. That is, preferably, the outer slide segment 22 and the inner slide segment 26 are mirror images of one another. In addition, the intermediate segment 24 has two halves that are mirror images of one another. The outer slide segment 22 and the inner slide segment 26 each include a central portion (22a and 26a, respectively) and upper portions (22b and 26b, respectively) and lower portions (22c and 26c, respectively) that are offset from the central portion (22a and 26a) toward the center of the assembly and/or the intermediate segment 24. Preferably, the offset is sufficient to accommodate the head of the fasteners 92.

The intermediate segment 24 is shaped generally like an I-beam in cross-section or when viewed from the front and includes a central vertical wall portion, an upper flange portion and a lower flange portion. In the illustrated arrangement, the intermediate segment 24 is constructed from a pair of generally C-shaped members 94 connected back-to-back. Each C-shaped member 94 includes a vertical wall portion or web 96, an upper flange 98 and a lower flange 100. Each of the flanges 98, 100 include a return portion 98a, 100a, which extend towards one another. The webs 96 of the C-shaped members 96 are connected by any suitable arrangement, such as a plurality of suitable fasteners 102 (e.g., rivets).

Preferably, each of the outer slide segment 22 and the inner slide segment 26 is supported for movement relative to the intermediate slide segment 24 by a plurality of rollers 110. Each of the rollers 110 includes an axle or hub 112 that is fixedly supported within an opening of the outer slide segment 22 or the inner slide segment 26. A roller portion 114 is rotatably supported on the hub 112. Each roller 110 contacts the upper flange 98 or lower flange 100 of the C-shaped members 94. The return portions 98a and 100a contact the rollers 100 to maintain the outer slide segment 22 and the inner slide segment 26 in engagement with the intermediate slide segment 24. Preferably, at least the roller portions 114 are constructed of a nylon material for low rolling resistance and durability. In some arrangements, both the hub 112 and the roller portion 114 can be a plastic material, such as nylon, for example and without limitation. In some arrangements, the hub 112 is constructed from a metal material, such as steel or brass, for example but without limitation.

In the illustrated configuration, the rollers 110 are separated into an upper row 110a and a lower row 110b. The upper row 110a contacts the upper bearing surface of the intermediate slide segment 24. Similarly, the lower row 110b contacts the lower bearing surface of the intermediate slide segment 24. Preferably, the upper and lower rollers 110 are offset from one another in a vertical direction. In the illustrated arrangement, at least one of an upper or lower roller 110 is positioned on the inner slide segment 26 so that it is located at or near the lower, forward end of the intermediate slide segment 24 and at least one of an upper or lower roller 110 is positioned on the outer slide segment 22 so that it is located at or near the lower, rearward end of the intermediate slide segment 24 when the slide assembly 20 is in the open position. With such an arrangement, rollers 110 are located at the highest load areas of the slide assembly 20 in the open position. Although rollers 110 are illustrated, other suitable mechanisms may be used to allow smooth movement between the individual segments 22, 24, 26, including ball bearings or solid bearing surfaces, for example and without limitation.

The slide assembly 20 may include multiple locks, which operate to secure segments in desirable positions relative to one another and release the segments at a desirable time during cycling of the slide assembly 20. Preferably, a first lock arrangement 120 secures the intermediate segment 24 in an open position relative to the outer segment 22. The first lock 120 includes a lock-arm or latch 122 that is secured to the intermediate slide segment 24, preferably by a fastener, such as a rivet 124. The latch 122 is coupled to the inboard side of the outboard C-shaped member 94 of the intermediate slide segment 24 and extends through an opening 128 in the inboard C-shaped member 94 of the intermediate slide segment 24 toward the outer slide segment 22. The latch 122 preferably is gravity-biased toward a locked position by virtue of the rivet 124 being located at or near an end of the latch 122; however, it could also be biased toward the locked position by a biasing member. An engagement portion 130 of the latch 122 engages a stop or tab 132 on the outer slide segment 22 when the intermediate slide segment 24 reaches an open position relative to the outer slide segment 22 to secure the intermediate slide segment 24 in the open position. The latch 122 also includes a release portion 134 that is engaged by the inner slide segment 26 when sufficiently closed relative to the intermediate slide segment 24. As a result, the inner slide segment 26 lifts the release portion 134 such that the engagement portion 130 is moved out of engagement with the tab 132 thereby releasing the intermediate slide segment 24 to move toward the closed position relative to the outer slide segment 22. The intermediate slide segment 24 is then able to close relative to the outer slide segment 22.

The slide assembly 20 also includes a second lock arrangement 140 that operates to selectively secure the inner slide segment 26 in an open position relative to the intermediate slide segment 24 and prevents movement in at least one direction from the open position. In the illustrated arrangement, the second lock 140 prevents or inhibits movement in both directions from the open position. In other words, the second lock 140 prevents removal of the inner slide segment 26 from the intermediate slide segment 24. In addition, closing of the inner slide segment 26 is inhibit or prevented until the second lock 140 is released.

The second lock 140 preferably includes a latch 142 carried by the inner slide segment 26 and positioned in a space between the inner slide segment 26 and the intermediate slide segment 24. The latch 142 selectively engages the intermediate slide segment 24 when the inner slide segment 26 is in an extended position relative to the intermediate slide segment 24 thereby securing the inner slide segment 26 in an extended or open position relative to the intermediate slide segment 24. In particular, the illustrated latch 142 is a resilient lock-arm that is carried by the inner slide segment 26 via at least one and preferably a pair of tabs 144 that engage openings or slots 146 of the latch 142. Each of the pair of tabs 144 preferably is created by a bent portion of the material of the inner slide segment 26.

The latch 142 includes an opening 148 that selectively engages an engagement member of the intermediate slide segment 24, which can be in the form of a tab 150. In the illustrated arrangement, the tab 150 is bent from the material of the intermediate slide segment 24. The opening 148 is located on an opposite end of the latch 142 from the slots 146 that secure the latch 142 to the inner slide segment 26. The latch 142 is bent such that it is normally biased toward an engaged position in which the opening 148 will engage the tab 150 when aligned therewith.

The latch 142 defines a ramped surface portion 152 at an end nearest the opening 148. The ramped surface portion 152 contacts the tab 150 as the inner slide segment 26 is moved toward the open position relative to the intermediate slide segment 24 and biases the latch 142 away from its engaged position. Once the opening 148 is aligned with the tab 150, the latch 142 returns toward or to its engaged position to engage the tab 150 and secure the inner slide segment 26 in an extended or open position relative to the intermediate slide segment 24. Thus, the ramped surface portion 152 allows the latch 142 to move past the tab 150 without manual manipulation of the latch 142. The latch 142 can be manually manipulated away from the engaged position to release the tab 150 from the opening 148 and allow the inner slide segment 26 to be retracted or removed from the intermediate slide segment 24. The illustrated latch 142 also includes one and preferably a pair of cut-outs 154 that accommodate the rollers 110 of the inner slide segment 26.

Although two lock arrangements are disclosed herein and referred to as first and second locks, it is not required nor implied that both lock arrangements are necessarily present in any particular embodiment. Rather, one or both of the lock arrangements may be used depending on the particular application and the desired operational sequence of the slide assembly. Moreover, additional lock arrangements may also be provided. In addition, the use of the term "lock" herein can also include structures that provide a "detent" function, unless otherwise indicated or made clear from the specific context.

Preferably, the inner slide segment 26 is configured to support an object. As described above, in one arrangement, the slide segment 26 is configured to support a KVM. In the illustrated arrangement, the inner slide segment 26 includes a plurality of openings or slots 160 that permit an object, such as a KVM, to be coupled to the inner slide segment 26. However, other suitable arrangements can also be used, such as keyholes which receive rivets or pins provided on the KVM (not shown), for example and without limitation.

The components of the slide assembly 20 may be constructed of any suitable material and by any suitable manufacturing process. However, in a particularly preferred embodiment, the components of the slide assembly 20 are constructed from suitable steel materials. The components can be shaped by any suitable process, including bending or roll forming techniques, for example but without limitation. In some configurations, one or more of the components are created from a flat sheet of material in a cutting step by a cutting machine, such as a laser cutter or turret press, and then formed into the desired cross-sectional shape, such as by a press brake or other bending machine. Alternatively, dedicated tools and/or equipment can be used to cut a flat work piece to length, add any through-holes, openings or other features. Secondary dedicated tools and/or equipment can then be used to shape the component into the desired cross-sectional shape and add any remaining through-holes, openings or other features.

In operation, the slide assembly 20 is coupled to the server rack. One of the brackets 34, 36 is coupled to the respective one of the forward or rearward vertical rails of the server rack. The channels 30 and 32 can be moved relative to one another (if necessary) to adjust the length of the mounting arrangement 28 such that the other of the brackets 34, 36 can be coupled to the other of the forward and rearward rails of the server rack. Typically, another slide assembly 20 is secured to the other side of the server rack. A KVM can be connected to the inner slide segment 26 of the slide assembly 20 by using suitable fasteners passing through the openings 160 of the inner slide segment 26 and engaging the KVM.

From a closed position, the KVM (computer server or other object) can be moved to open (or extend) the slide assembly 20. As the slide assembly 20 is extended, the lock 120 engages to secure the intermediate slide segment 24 in an open position relative to the outer slide segment 22. The lock 140 then engages to secure the inner slide segment 26 in the open position. To retract the slide assembly 20, the lock 140 is released (either manually or automatically) and the inner slide segment 26 is retracted. The inner slide segment 26 contacts the release portion 134 of the latch 122 to disengage the lock 120, which permits the intermediate slide segment 24 to retract relative to the outer slide segment 22.

FIGS. 15-18 illustrate another embodiment of a slide assembly 20, which is a modification of the slide assemblies 20 of FIGS. 1-14. The slide assembly 20 of FIGS. 15-18 is similar to the slide assemblies 20 of FIGS. 1-14. Accordingly, the same reference numerals are used to refer to the same or corresponding elements or features. In addition, because the slide assemblies are similar, only significant differences are described herein. Any structure, elements or features not described can be assumed to be the same as or similar to the corresponding structure, elements or features of the slide assemblies 20 of FIGS. 1-14, or of any other suitable arrangement.

The lock arrangement 140 is constructed to inhibit or prevent unintentional or undesirable removal of the inner slide segment 26 from the intermediate slide segment 24, but to permit closure or retraction of the inner slide segment 26 without manual manipulation of the latch 142. In particular, the latch 142 includes an angled release tab 200 located at a forward end of the opening 148 and extending from the main body of the latch 142 in the same direction as the angled surface portion 152 (toward the inner slide segment 26) in a lateral direction and rearwardly or toward a rearward end of the opening 148 in a longitudinal direction. The angled release tab 200 contacts the tab 150 of the intermediate slide segment 24 and automatically disengages the latch 142 from the tab 150 upon rearward movement of the inner slide segment 26. Thus, preferably, manual manipulation of the latch 142 allows the inner slide segment 26 to be removed from the intermediate slide segment 24, but the inner slide segment 26 can close without manipulation of the latch 124.

Preferably, the slide assembly 20 includes a detent arrangement 210 that holds the inner slide segment 26 in a desired position relative to the intermediate slide segment 24 until it is desired to move the inner slide segment 26. Thus, preferably, the detent arrangement 210 develops a force sufficient to retain the inner slide segment 26 in the desired position in the absence of any significant force acting to move the inner slide segment 26, including indirect forces (e.g., vibrations) or direct forces (e.g., small force inputs or incidental contact with the inner slide segment 26 or KVM). Thus, the detent arrangement 210 reduces the likelihood of accidental or unintentional movement of the slide assembly 20. The force required to overcome the detent arrangement 210 can be adjusted as desired for the particular application of the slide assembly 20, such as by adjustment of material selection or dimensions, for example.

The illustrated detent arrangement 210 comprises a detent latch 212 carried by the inner slide segment 26 (not shown in FIG. 17 for clarity) and including at least one and preferably four resilient arms 214, each having an engagement portion 216, such as a semi-spherical protuberance. One or more of the engagement portions 216 are configured to engage a corresponding recess or opening 218 of the intermediate slide segment 24 in a detent position of the inner slide segment 26. At least one and preferably a pair of the openings 218 are located relative to the detent latch 212 such that at least one (and preferably a pair) of the engagement portions 216 engage the openings 218 when the inner slide segment 26 is in an open or extended position relative to the intermediate slide segment 24. Preferably, at least one (and preferably a pair) of the engagement portions 216 do not engage the openings 218 in the open position. Preferably, at least another one and preferably another pair of the openings 218 (FIG. 15) are located such that at least one (and preferably a pair) of the engagement portions 216 engage the openings 218 when the inner slide segment 26 is in a closed or retracted position relative to the intermediate slide segment 24. Accordingly, in the illustrated embodiment, a forward pair of the arms 214 is used in the detent open position and a rearward pair of the arms 214 is used in the detent closed position. Thus, the illustrated detent arrangement 210 is a detent-open and a detent-closed arrangement; however, one or the other could be omitted. In addition or in the alternative, other detent positions could also be provided.

The slide assembly 20 can be constructed in various sizes including sizes corresponding to 1 U, 2 U, 3 U, 4 U, 5 U, 6 U and larger server arrangements. The embodiments described herein can be constructed and sized to a desired server size/arrangement and each embodiment may also be constructed and sized to other applications outside of KVMs, computers and servers.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In particular, while the present slide assemblies have been described in the context of particularly preferred embodiments, the skilled artisan will appreciate, in view of the present disclosure, that certain advantages, features and aspects of the assemblies may be realized in a variety of other applications, many of which have been noted above. Additionally, it is contemplated that various aspects and features of the invention described can be practiced separately, combined together, or substituted for one another, and that a variety of combination and subcombinations of the features and aspects can be made and still fall within the scope of the invention. Thus, it is intended that the scope of the present invention herein disclosed should not be limited by the particular disclosed embodiments described above, but should be determined only by a fair reading of the claims.

What is claimed is:

1. A slide assembly, comprising:
an outer slide segment having a first bearing surface and a second bearing surface; the outer slide segment attached to a plurality of rollers separated into an upper row and a lower row;
an intermediate slide segment telescopically engaged with the outer slide segment and supported by the plurality of rollers of the outer slide segment, the intermediate slide segment comprising a first C-shaped member and a second C-shaped member secured to one another in a back-to-back orientation, the plurality of rollers of the outer slide segment engaging the first C-shaped member;
an inner slide segment telescopically engaged with the intermediate slide segment, wherein the inner slide segment is a mirror image of the outer slide segment, the inner slide segment attached to a plurality of rollers separated into an upper row and a lower row, wherein the plurality of rollers contact the second C-shaped member of the intermediate slide segment to transfer the load applied to the slide assembly between the inner slide segment and the intermediate slide segment.

2. The slide assembly of claim 1, further comprising a first lock that secures the intermediate slide segment in an open position relative to the outer slide segment, wherein the first lock comprises a latch carried by the intermediate slide segment and which engages a stop of the outer slide segment, and wherein the inner slide segment moves the latch out of engagement with the stop.

3. The slide assembly of claim 2, further comprising a second lock that secures the inner slide segment in an open position relative to the intermediate slide segment, wherein the second lock comprises a lock arm carried by the inner slide segment and that engages a tab of the intermediate slide segment.

4. The slide assembly of claim 2, further comprising a detent arrangement configured to secure the inner slide segment in a desired position relative to the intermediate slide segment and which can be overcome with the application of force to the inner slide segment.

5. The slide assembly of claim 4, wherein the detent arrangement secures the inner slide segment in an open position and a closed position relative to the intermediate slide segment.

6. The slide assembly of claim 5, wherein the detent arrangement comprises a detent latch carried by the inner slide segment and having a plurality of latch arms, each having an engagement member that engages a corresponding recess or opening of the intermediate slide segment in at least one of the open position and the closed position.

7. The slide assembly of claim 6, wherein at least a first one of the plurality of latch arms engages the corresponding recess or opening in the open position and at least a second one of the plurality of latch arms engages the corresponding recess or opening in the closed position.

8. The slide assembly of claim 1, further comprising a mounting arrangement having a first bracket and a second bracket configured to engage a first mounting rail and a second mounting rail, respectively, of a server mounting rack, wherein the mounting arrangement defines a height that is at least twice a height of the inner, intermediate and outer slide segments.

9. The slide assembly of claim 8, wherein the first bracket is positioned at a forward end of the outer slide segment and the second bracket is positioned at a rearward end of the outer slide segment.

10. The slide assembly of claim 9, further comprising a retention latch associated with each of the first bracket and the second bracket and configured to secure the brackets to the respective first and second mounting rails.

11. The slide assembly of claim 1, wherein each of the plurality of rollers includes an axle that is fixed directly to the outer slide segment and the inner slide segment.

12. The slide assembly of claim 1, wherein each of the first C-shaped member and the second C-shaped member have end portions that extend toward each other.

13. The slide assembly of claim 12, wherein the end portions contact each of the plurality of rollers to maintain the outer slide segment and the inner slide segment in engagement with the intermediate slide segment.

14. The slide assembly of claim 13, wherein the outer slide segment and the inner slide segment each include upper portions, lower portions and a central portion, wherein the upper portions and the lower portions are offset from the central portion toward the center of the intermediate segment, and wherein the upper portions and the lower portions extend toward the end portions of the first C-shaped member and the second C-shaped member.

15. The slide assembly of claim 14, wherein each of the plurality of rollers includes an axle that is fixed directly to the upper portions or the lower portions of the outer slide segment and the inner slide segment.

16. A slide assembly, comprising:
an outer slide segment having a first bearing surface and a second bearing surface; the outer slide segment comprising a plurality of rollers separated into an upper row and a lower row;
an intermediate slide segment telescopically engaged with the outer slide segment and supported by the plurality of rollers of the outer slide segment, the intermediate slide segment comprising a first C-shaped member and a second C-shaped member secured to one another in a back-to-back orientation, the plurality of rollers of the outer slide segment engaging the first C-shaped member;
an inner slide segment telescopically engaged with the intermediate slide segment, wherein the inner slide segment is a mirror image of the outer slide segment, the inner slide segment comprising a plurality of rollers separated into an upper row and a lower row, wherein the plurality of rollers contact the second C-shaped member of the intermediate slide segment to transfer the load applied to the slide assembly between the inner slide segment and the intermediate slide segment;
a first lock that secures the intermediate slide segment in an open position relative to the outer slide segment, wherein the first lock comprises a latch carried by the intermediate slide segment and which engages a stop of the outer slide segment, and wherein the inner slide segment moves the latch out of engagement with the stop;
a detent arrangement configured to secure the inner slide segment in a desired position relative to the intermediate slide segment and which can be overcome with the application of force to the inner slide segment, wherein the detent arrangement secures the inner slide segment in an open position and a closed position relative to the intermediate slide segment.

* * * * *